(12) United States Patent
Basker et al.

(10) Patent No.: US 9,246,005 B2
(45) Date of Patent: Jan. 26, 2016

(54) STRESSED CHANNEL BULK FIN FIELD EFFECT TRANSISTOR

(71) Applicants: International Business Machines Corporation, Armonk, NY (US); Kabushiki Kaisha Toshiba, Tokyo (JP)

(72) Inventors: Veeraraghavan S. Basker, Schenectady, NY (US); Akira Hokazono, Kawasaki (JP); Hiroshi Itokawa, Kuwana (JP); Tenko Yamashita, Schenectady, NY (US); Chun-chen Yeh, Clifton Park, NY (US)

(73) Assignees: International Business Machines Corporation, Armonk, NY (US); KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/178,990

(22) Filed: Feb. 12, 2014

(65) Prior Publication Data
US 2015/0228789 A1 Aug. 13, 2015

(51) Int. Cl.
*H01L 27/088* (2006.01)
*H01L 29/78* (2006.01)
*H01L 21/8234* (2006.01)

(52) U.S. Cl.
CPC .... *H01L 29/7848* (2013.01); *H01L 21/823431* (2013.01); *H01L 27/0886* (2013.01)

(58) Field of Classification Search
CPC ............. H01L 29/785; H01L 29/7848; H01L 29/66795; H01L 21/8234; H01L 21/823431; H01L 27/088; H01L 27/0886; H01L 29/78; H01K 29/851
See application file for complete search history.

(56) References Cited

U.S. PATENT DOCUMENTS

| | | | |
|---|---|---|---|
| 6,130,467 A | 10/2000 | Bandyopadhyay et al. | |
| 6,583,488 B1 | 6/2003 | Xiang | |
| 7,190,036 B2 | 3/2007 | Ko et al. | |
| 7,361,571 B2 | 4/2008 | Nam | |
| 7,465,620 B2 | 12/2008 | Ko et al. | |
| 7,728,364 B2 | 6/2010 | Zhu et al. | |
| 8,338,260 B2 | 12/2012 | Cheng et al. | |
| 8,343,867 B2 | 1/2013 | Ng et al. | |
| 8,404,543 B2 | 3/2013 | Shin et al. | |
| 8,877,615 B2* | 11/2014 | Basker et al. | 438/479 |
| 8,962,400 B2* | 2/2015 | Tsai et al. | 438/157 |
| 2008/0113476 A1* | 5/2008 | Anderson et al. | 438/198 |
| 2009/0152623 A1* | 6/2009 | Goto et al. | 257/329 |

(Continued)

*Primary Examiner* — Tan N Tran
*Assistant Examiner* — Fazli Erdem
(74) *Attorney, Agent, or Firm* — Scully, Scott, Murphy & Presser, P.C.; Steven J. Meyers, Esq.

(57) ABSTRACT

Effective transfer of stress to a channel of a fin field effect transistor is provided by forming stress-generating active semiconductor regions that function as a source region and a drain region on a top surface of a single crystalline semiconductor layer. A dielectric material layer is formed on a top surface of the semiconductor layer between semiconductor fins. A gate structure is formed across the semiconductor fins, and the dielectric material layer is patterned employing the gate structure as an etch mask. A gate spacer is formed around the gate stack, and physically exposed portions of the semiconductor fins are removed by an etch. Stress-generating active semiconductor regions are formed by selective epitaxy from physically exposed top surfaces of the semiconductor layer, and apply stress to remaining portions of the semiconductor fins that include channels.

13 Claims, 16 Drawing Sheets

(56) References Cited

U.S. PATENT DOCUMENTS

| | | | |
|---|---|---|---|
| 2009/0261380 A1* | 10/2009 | Anderson et al. | 257/190 |
| 2010/0038679 A1* | 2/2010 | Chan et al. | 257/190 |
| 2011/0068407 A1* | 3/2011 | Yeh et al. | 257/369 |
| 2011/0147842 A1* | 6/2011 | Cappellani et al. | 257/365 |
| 2011/0291188 A1* | 12/2011 | Cheng et al. | 257/347 |
| 2012/0018730 A1* | 1/2012 | Kanakasabapathy et al. | 257/66 |
| 2012/0074464 A1* | 3/2012 | Cea et al. | 257/190 |
| 2012/0280250 A1* | 11/2012 | Basker et al. | 257/77 |
| 2012/0319211 A1* | 12/2012 | van Dal et al. | 257/401 |
| 2013/0020612 A1* | 1/2013 | Wann et al. | 257/190 |
| 2013/0069160 A1 | 3/2013 | Aquilino et al. | |
| 2013/0082304 A1* | 4/2013 | Liu et al. | 257/192 |
| 2013/0146942 A1* | 6/2013 | Zhu et al. | 257/190 |
| 2013/0181299 A1* | 7/2013 | Baldauf et al. | 257/401 |
| 2013/0270638 A1* | 10/2013 | Adam et al. | 257/347 |
| 2013/0285152 A1* | 10/2013 | Adam et al. | 257/369 |
| 2014/0070316 A1* | 3/2014 | Chan et al. | 257/347 |
| 2014/0151756 A1* | 6/2014 | Chang et al. | 257/288 |
| 2014/0167163 A1* | 6/2014 | Cheng et al. | 257/347 |
| 2014/0225065 A1* | 8/2014 | Rachmady et al. | 257/24 |
| 2014/0285980 A1* | 9/2014 | Cappellani et al. | 361/748 |
| 2014/0299934 A1* | 10/2014 | Kim et al. | 257/347 |
| 2015/0028419 A1* | 1/2015 | Cheng et al. | 257/347 |
| 2015/0041897 A1* | 2/2015 | Basker et al. | 257/347 |
| 2015/0041911 A1* | 2/2015 | Chan et al. | 257/369 |

* cited by examiner

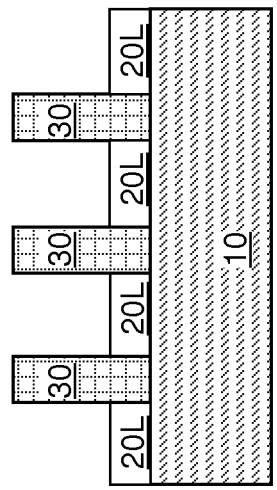
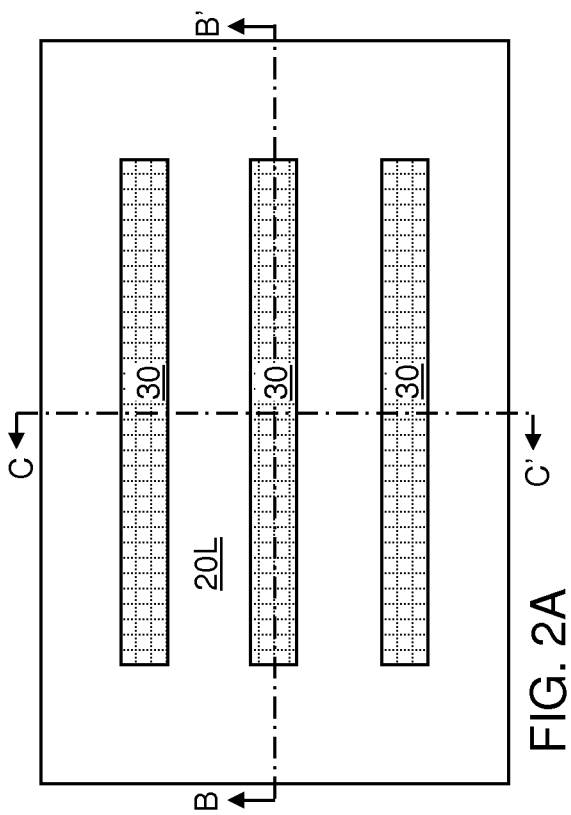
FIG. 2A
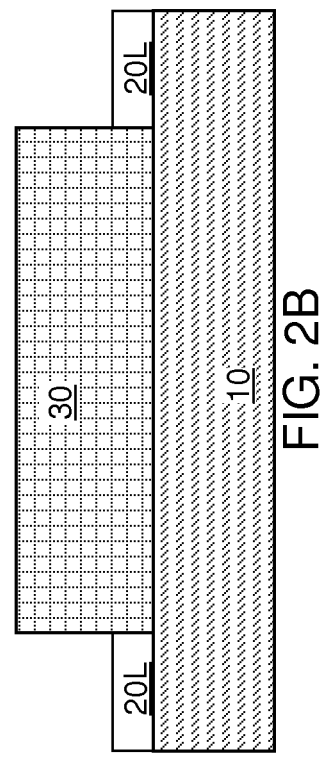
FIG. 2C
FIG. 2B

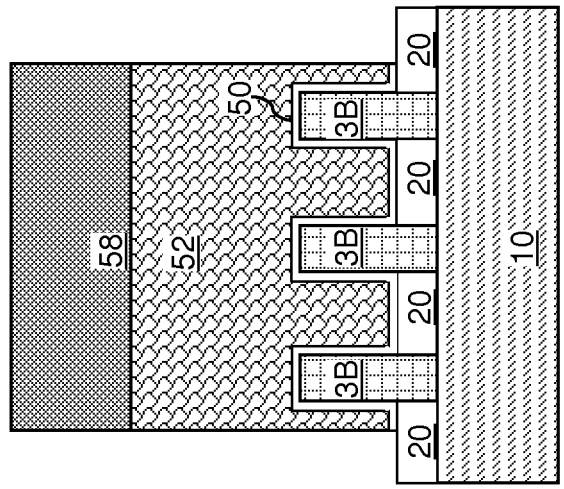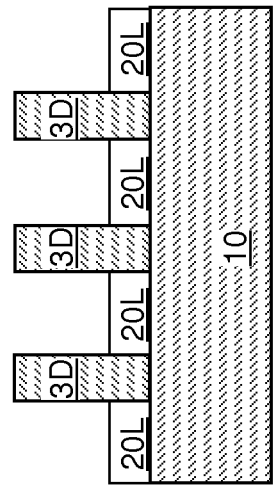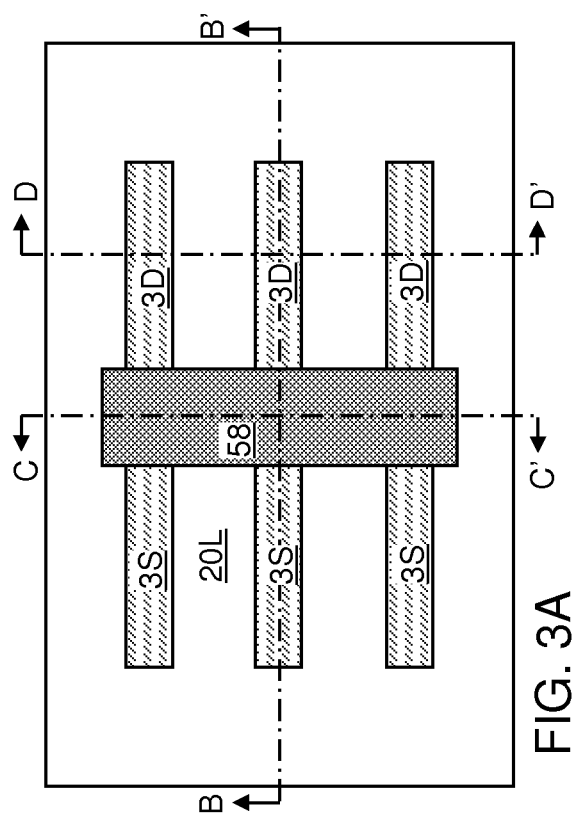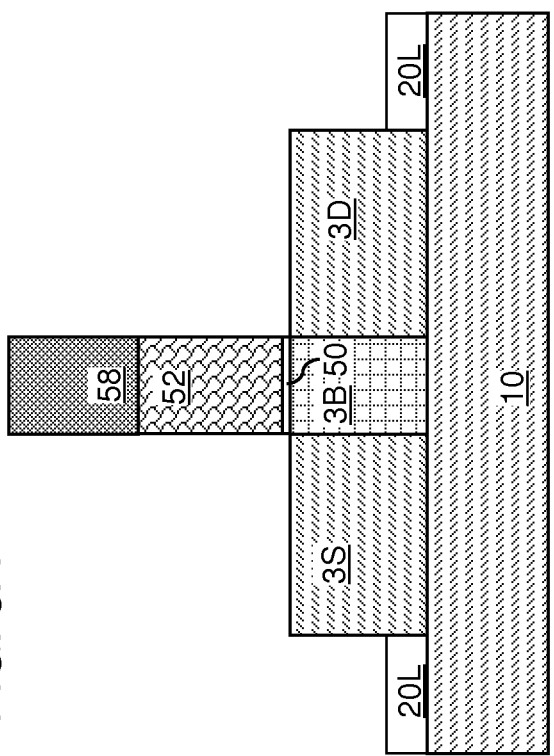

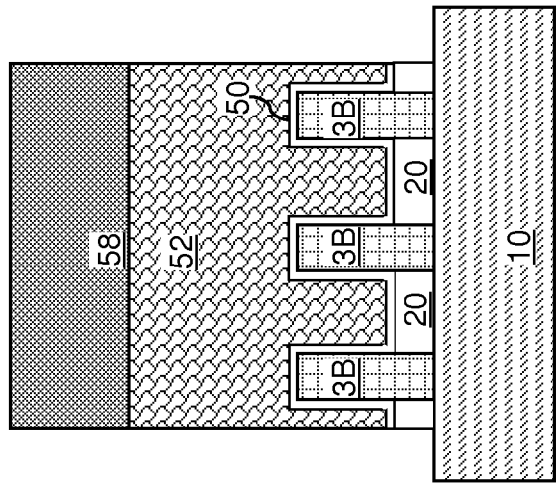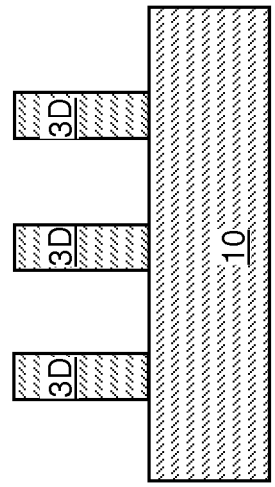
FIG. 4A  FIG. 4C
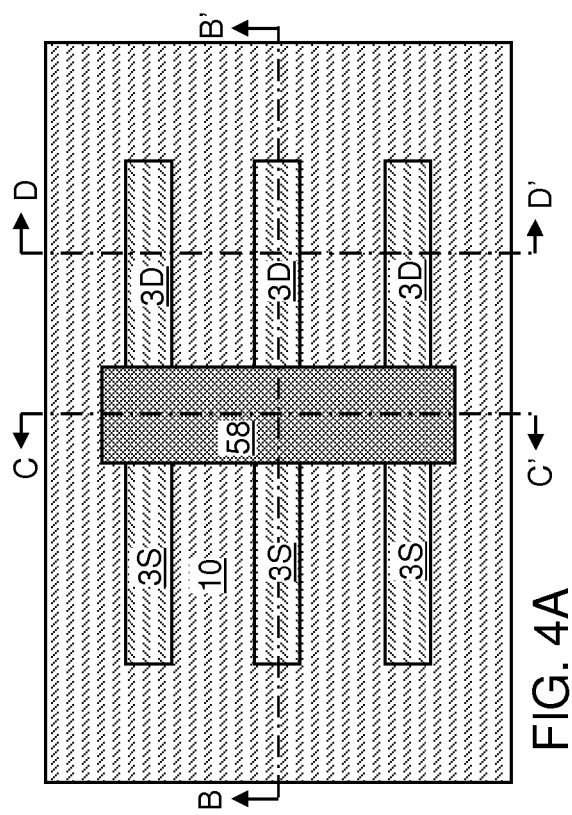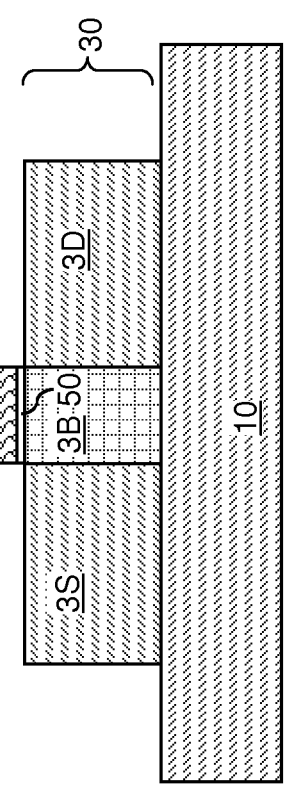
FIG. 4B  FIG. 4D

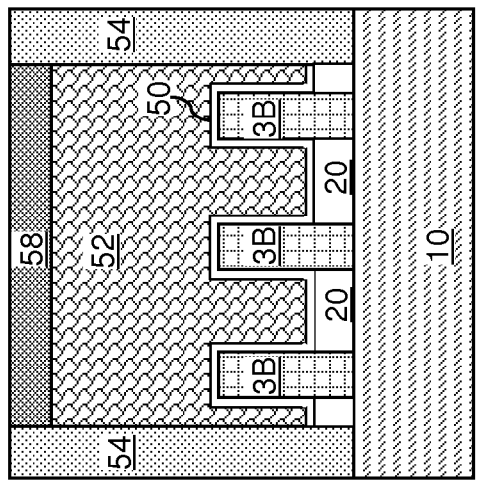
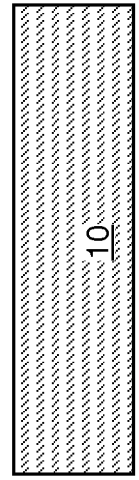
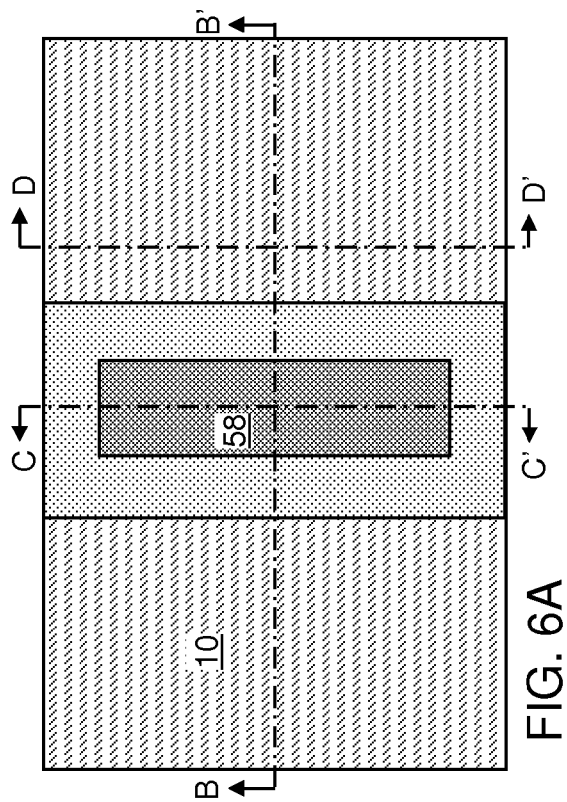
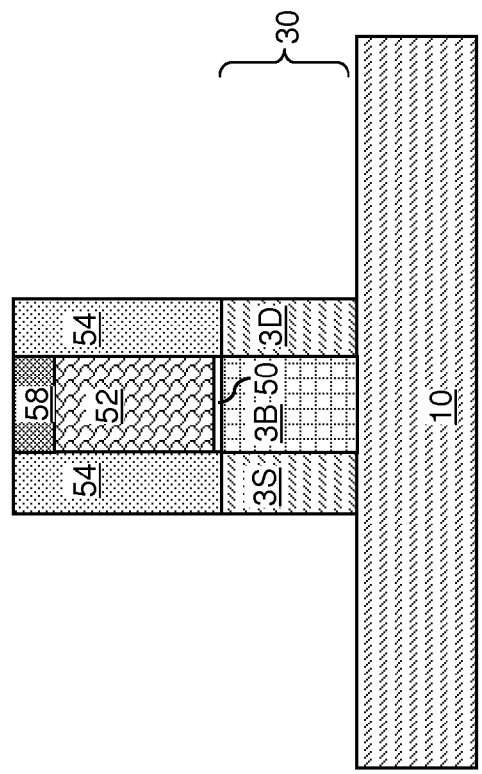

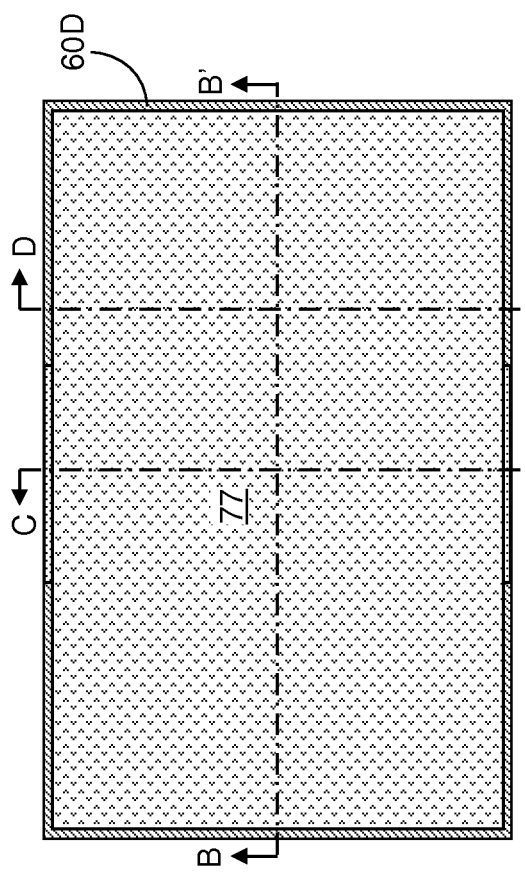
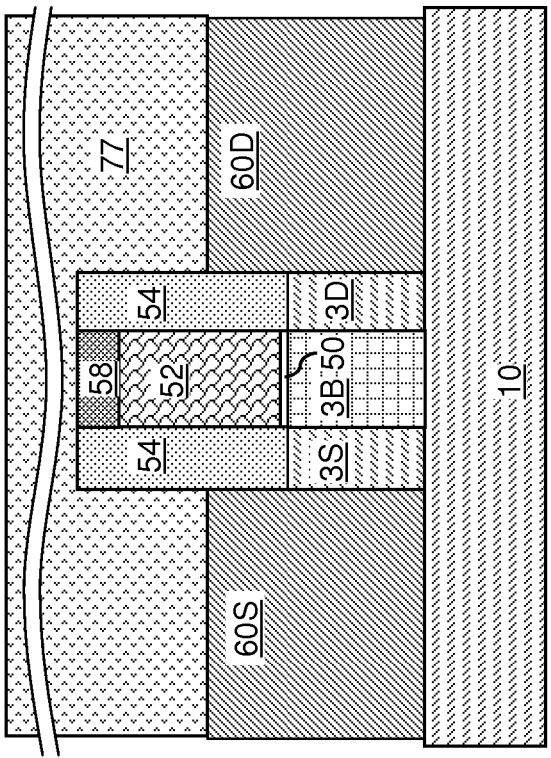
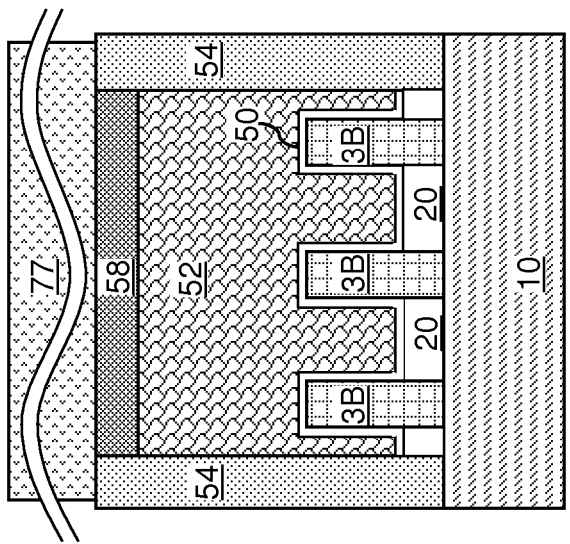
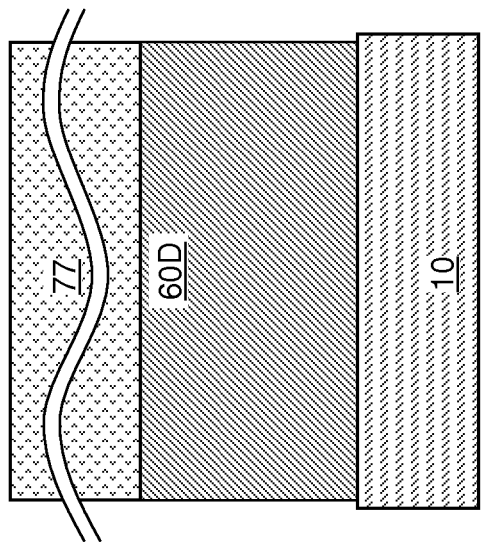

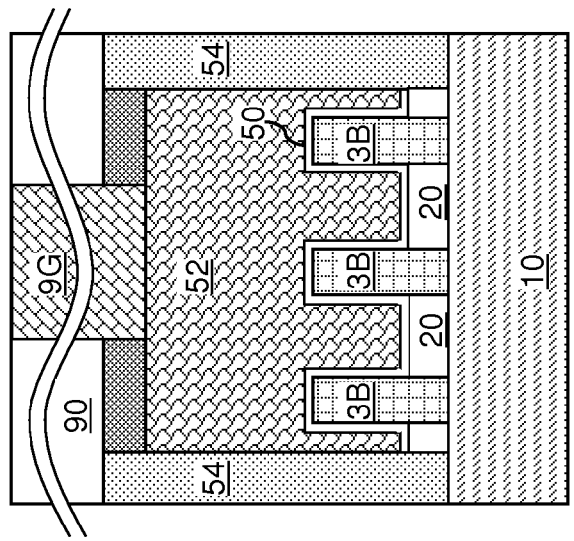
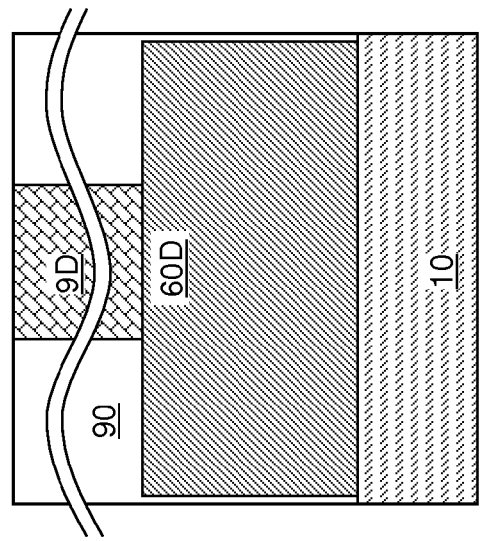
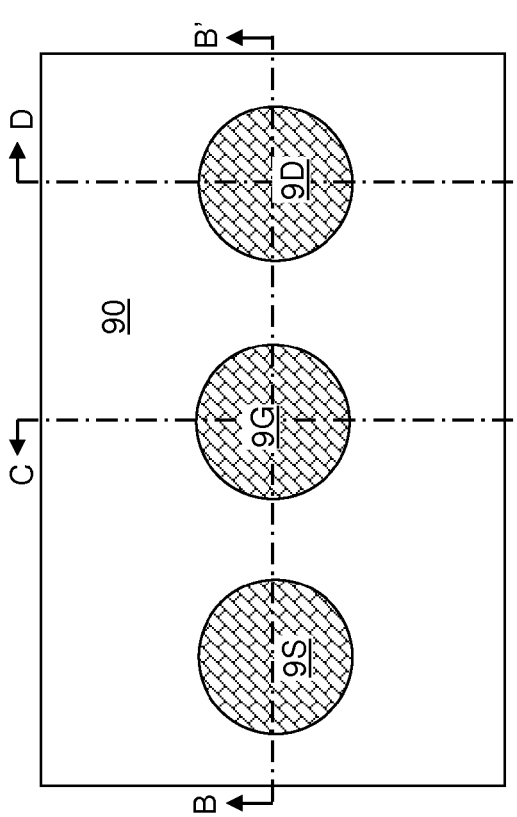
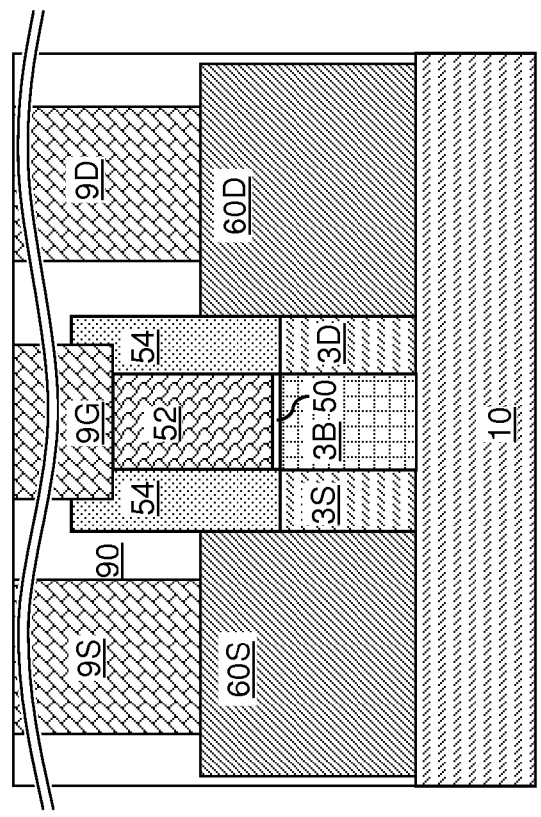

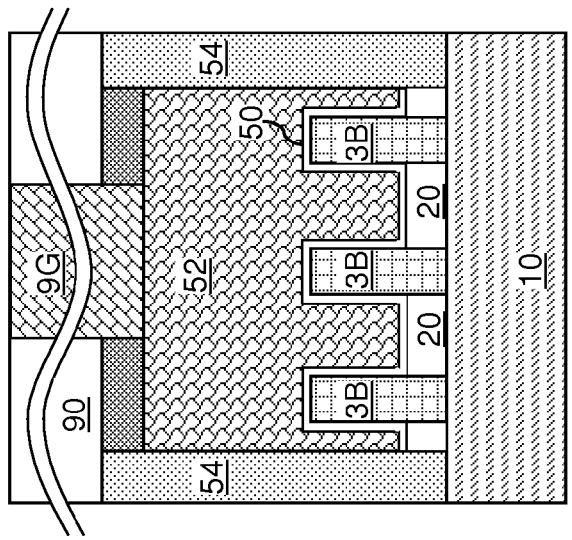
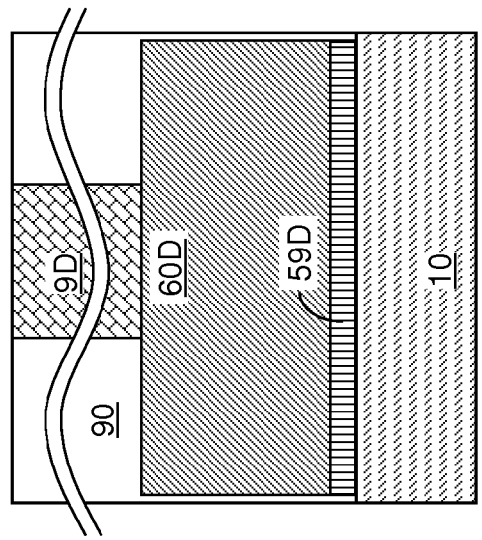
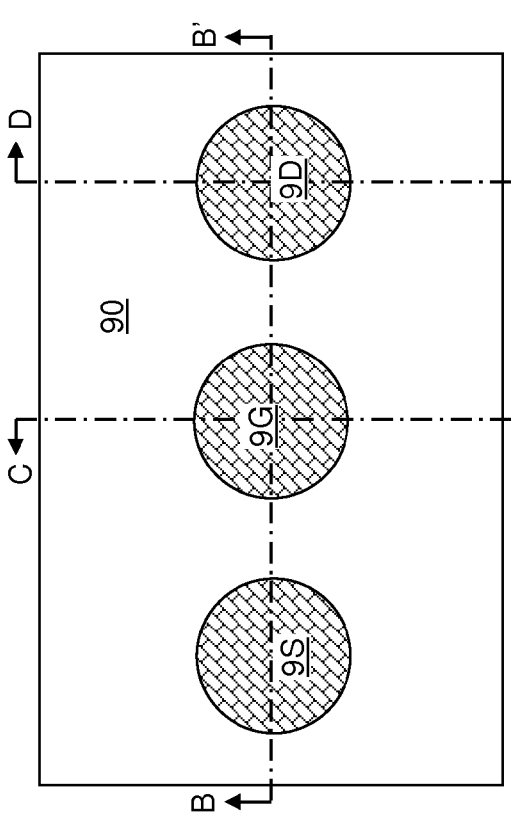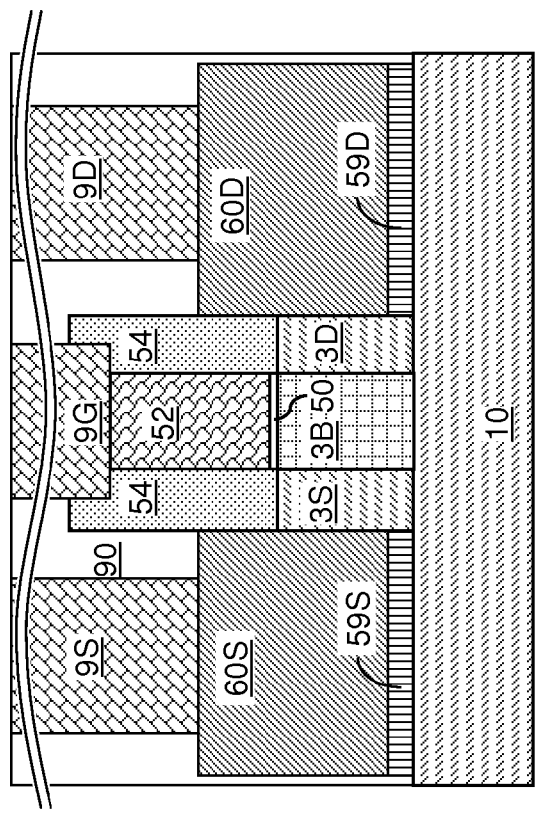
FIG. 11A
FIG. 11B
FIG. 11C
FIG. 11D

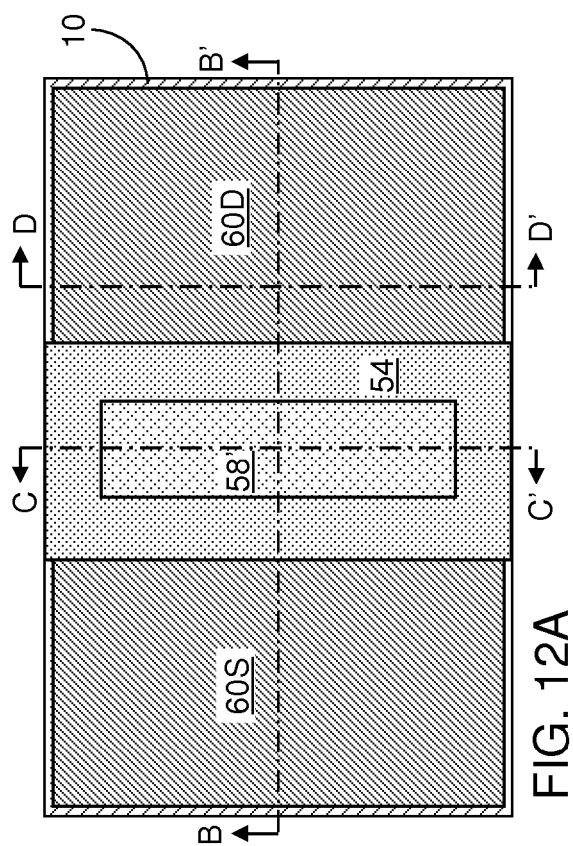
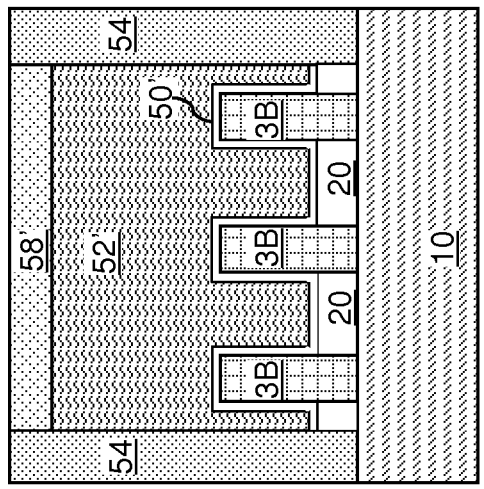
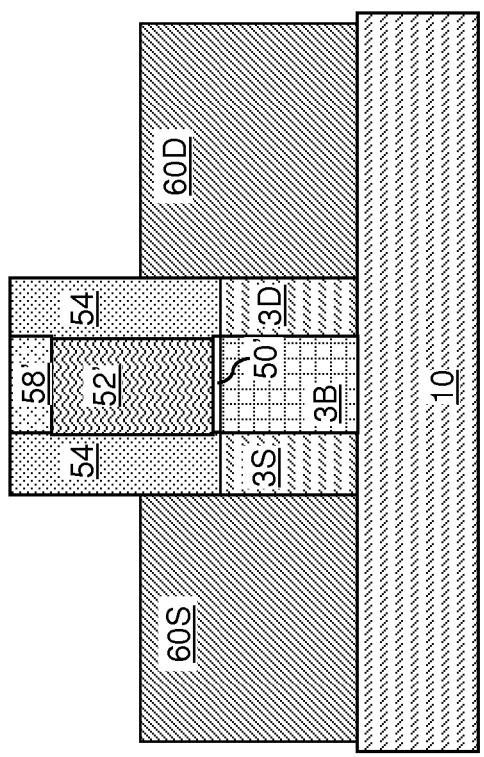
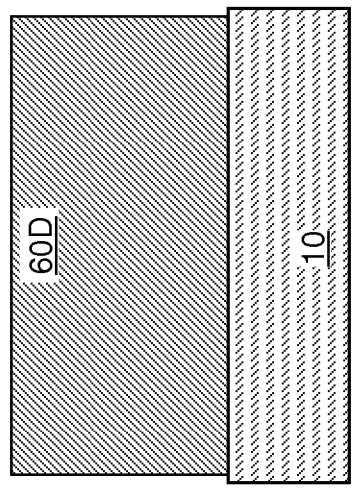

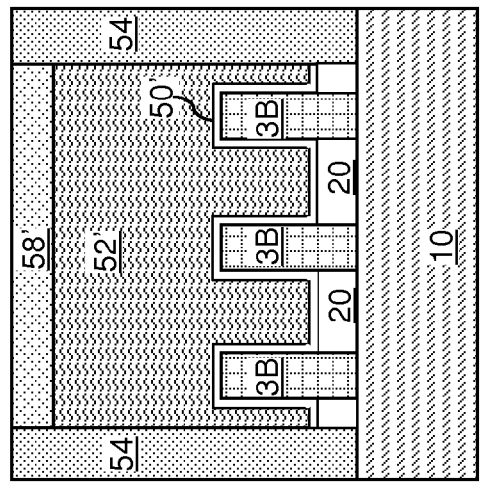
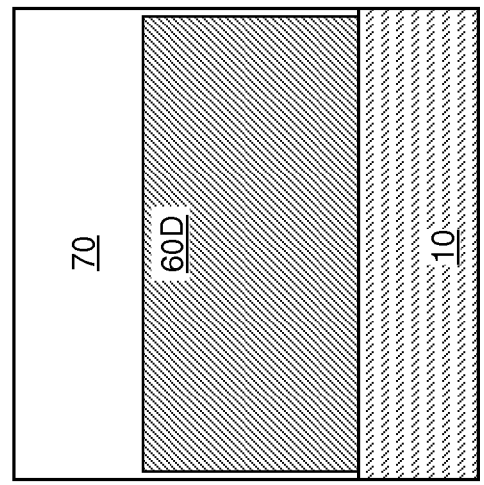
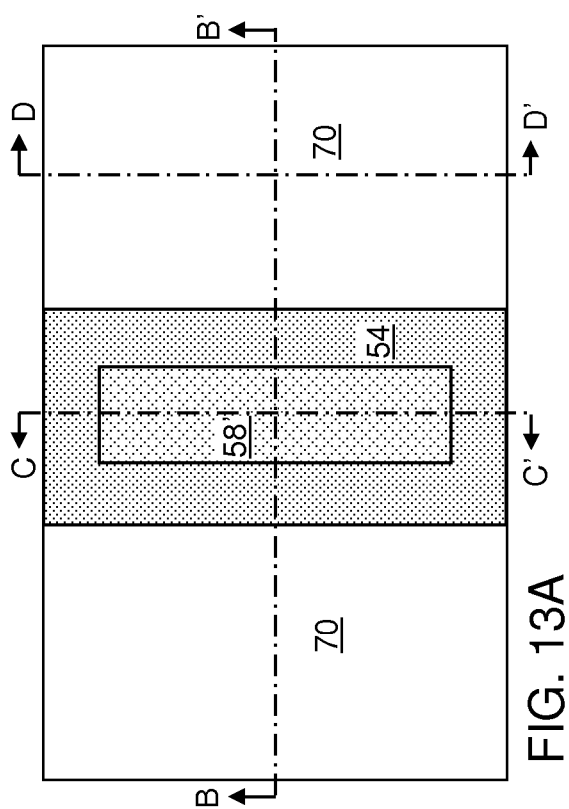
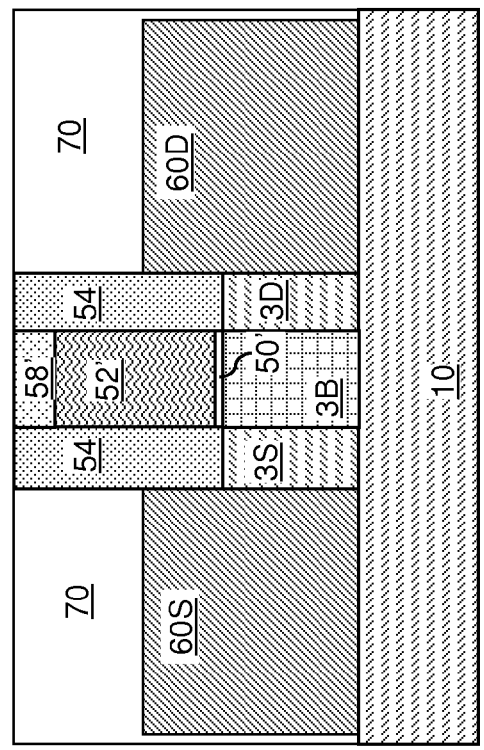
FIG. 13A
FIG. 13B
FIG. 13C
FIG. 13D

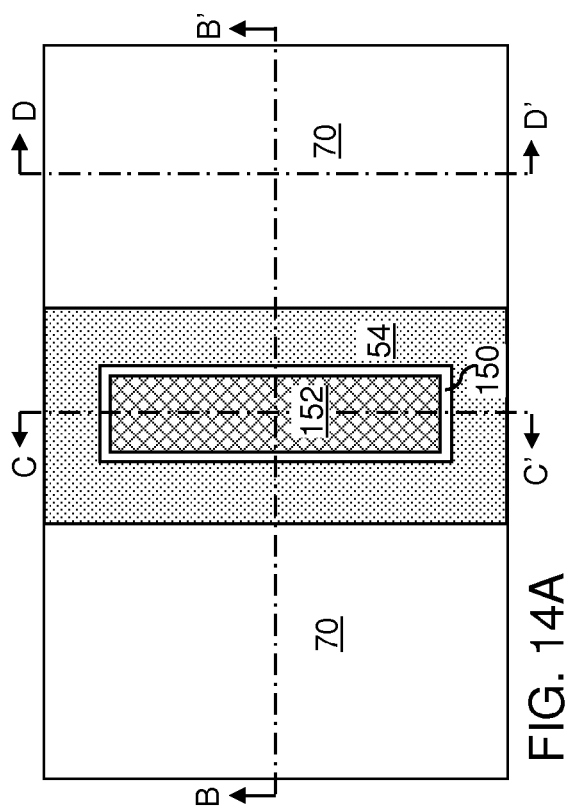
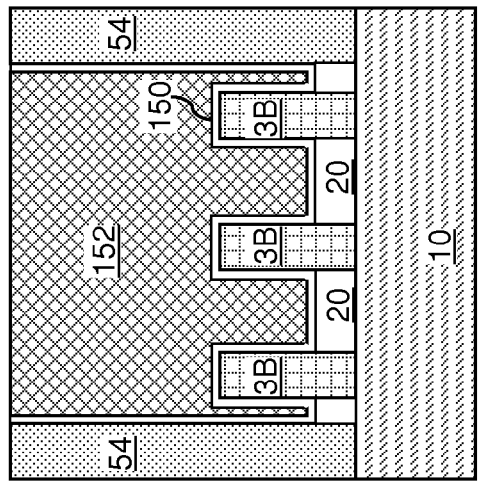
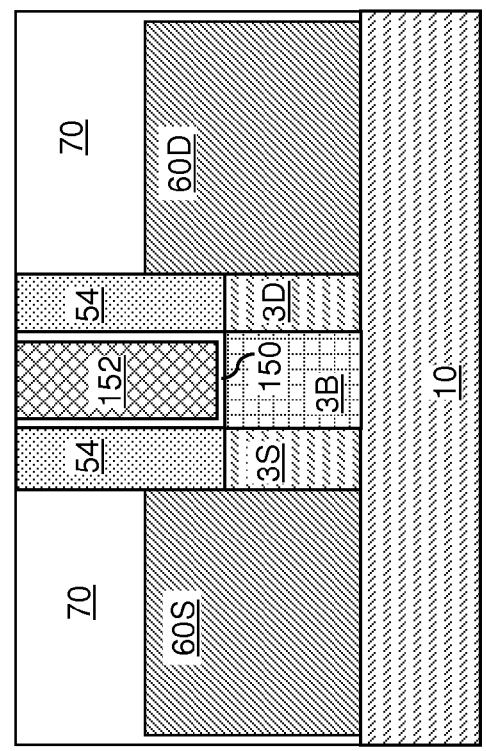
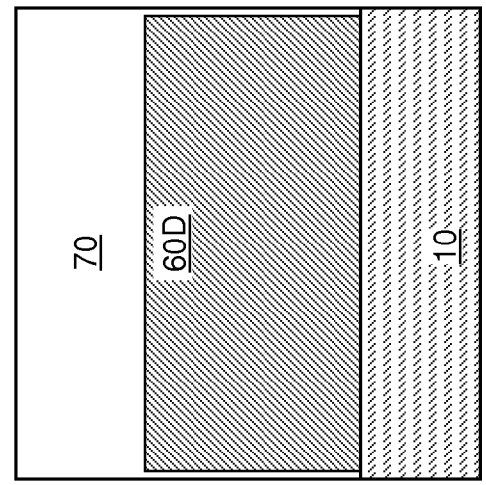
FIG. 14A
FIG. 14B
FIG. 14C
FIG. 14D

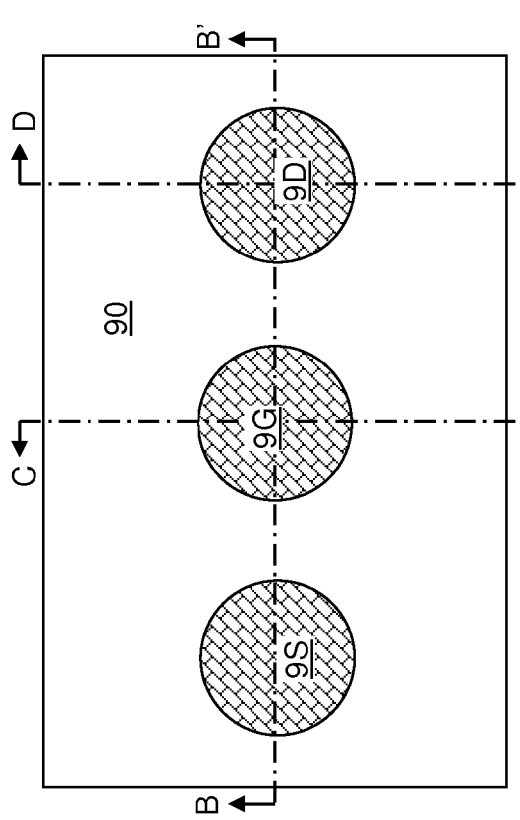
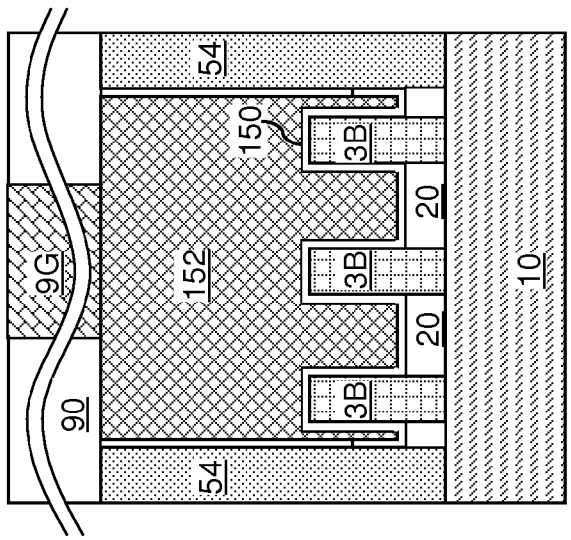
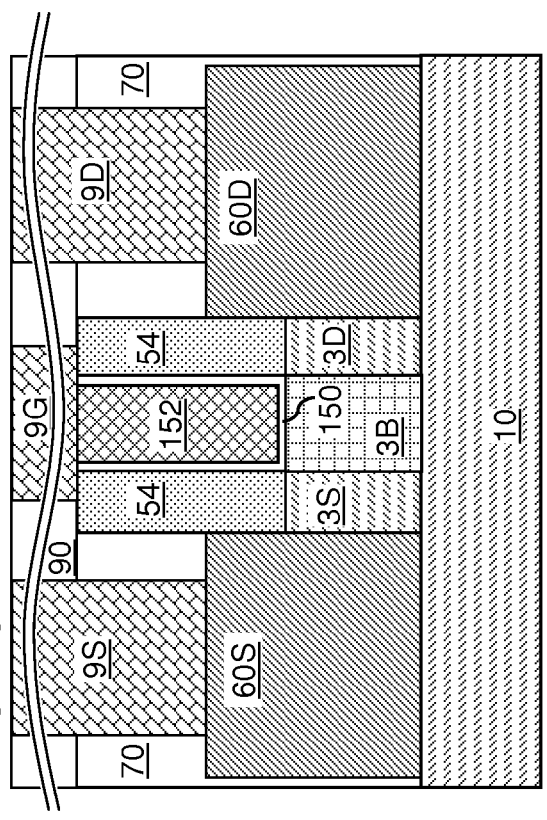
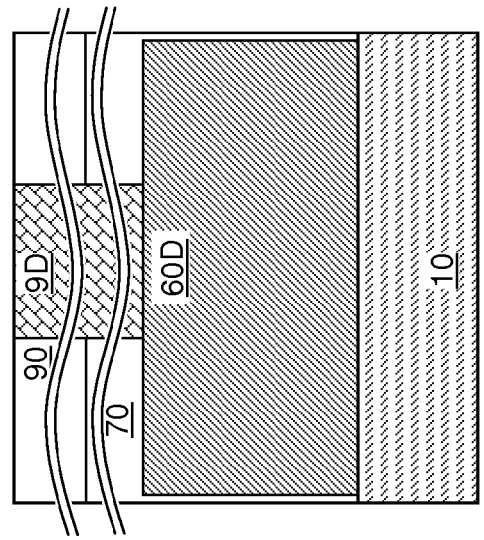
FIG. 15A
FIG. 15B
FIG. 15C
FIG. 15D

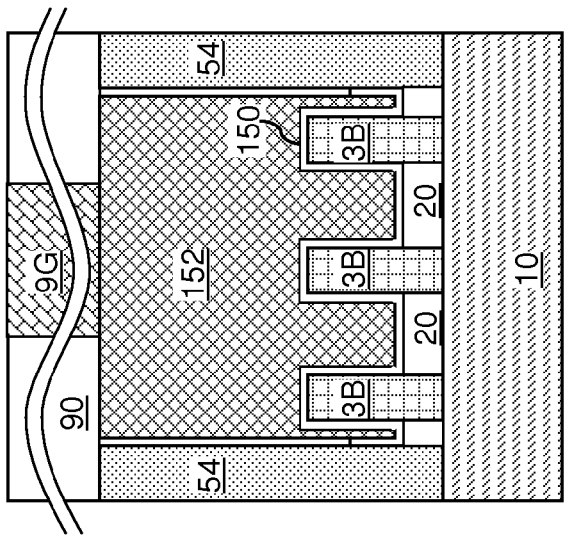
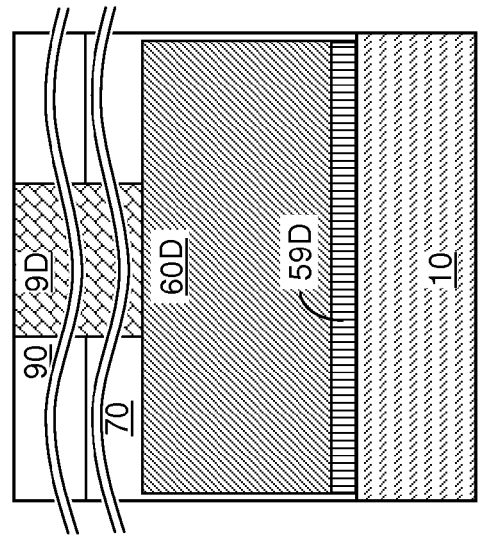
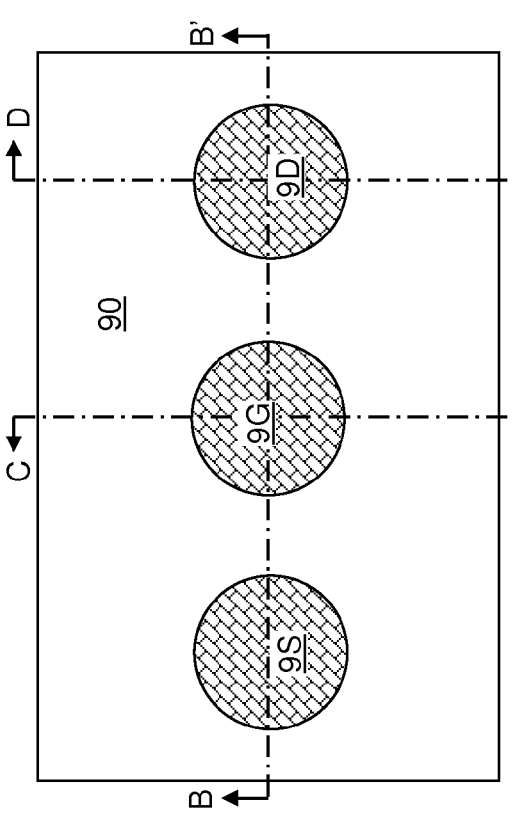
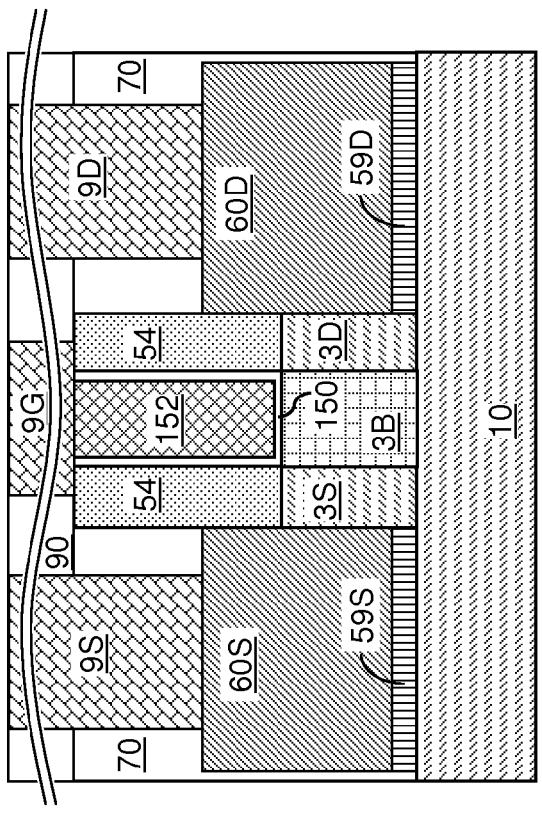

STRESSED CHANNEL BULK FIN FIELD EFFECT TRANSISTOR

BACKGROUND

The present disclosure relates to a semiconductor structure, and more particularly to a fin field effect transistor on a bulk substrate that includes stress-generating active semiconductor regions anchored to an underlying semiconductor layer, and a method of manufacturing the same.

A finFET is field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

Stress in a channel region of a fin field effect transistor can enhance the performance of the fin field effect transistor by increasing the mobility of minority charge carriers within the channel region. However, formation of stressed channels in conventional fin field effect transistors formed on a bulk semiconductor substrate is difficult because epitaxial semiconductor materials formed on sidewalls of semiconductor fins are ineffective in transferring a stress to the channels of field effect transistors.

SUMMARY

Effective transfer of stress to a channel of a fin field effect transistor is provided by forming stress-generating active semiconductor regions that function as a source region and a drain region on a top surface of a single crystalline semiconductor layer. A dielectric material layer is formed on a top surface of the semiconductor layer between semiconductor fins. A gate structure is formed across the semiconductor fins, and source and drain extension ion implantation can be performed on the semiconductor fins employing the gate structure as an implantation mask. The dielectric material layer is patterned employing the gate structure as an etch mask. A gate spacer is formed around the gate stack, and physically exposed portions of the semiconductor fins are removed by an etch. Stress-generating active semiconductor regions are formed by selective epitaxy from physically exposed top surfaces of the semiconductor layer, and apply stress to remaining portions of the semiconductor fins that include channels. Decoupling of a gate electrode from the semiconductor layer is provided by dielectric material portions that are remaining portions of the dielectric material layer. The gate spacer increases the physical distance between the source region and the drain region, thereby reducing the leakage current between the source region and the drain region through the semiconductor layer.

According to an aspect of the present disclosure, a semiconductor structure includes a single crystalline material layer located in a substrate, and a plurality of semiconductor fins located on a top surface of the single crystalline material layer. At least one dielectric material portion is located on the top surface of the single crystalline material layer and laterally contacting bottom portions of the plurality of semiconductor fins. The semiconductor structure further includes a gate structure, which includes a vertical stack of a gate dielectric and a gate electrode and contacting a top surface of each of the at least one dielectric material portion and sidewalls of the plurality of semiconductor fins. The semiconductor structure further includes a gate spacer laterally contacting sidewalls of the gate structure and sidewalls of the at least one dielectric material portion and a top surface of the single crystalline material layer.

According to another aspect of the present disclosure, a method of forming a semiconductor structure is provided. A plurality of semiconductor fins is formed over a single crystalline material layer. A dielectric material layer is formed, which has a top surface below a horizontal plane including top surfaces of the plurality of semiconductor fins. A gate structure straddling the plurality of semiconductor fins is formed directly on the dielectric material layer. The gate structure includes a vertical stack of a gate dielectric and a gate electrode. At least one dielectric material portion is formed by patterning the dielectric material layer employing the gate structure as an etch mask. A gate spacer is formed directly on sidewalls of the gate structure and sidewalls of the at least one dielectric material portion and a top surface of the single crystalline material layer.

BRIEF DESCRIPTION OF SEVERAL VIEWS OF THE DRAWINGS

FIG. 2A is a top-down view of the first exemplary semiconductor structure after formation of a dielectric material layer according to the first embodiment of the present disclosure.

FIG. 2B is a vertical cross-sectional view of the first exemplary semiconductor structure along the vertical plane B-B' in FIG. 2A.

FIG. 2C is a vertical cross-sectional view of the first exemplary semiconductor structure along the vertical plane C-C' in FIG. 2A.

FIG. 3A is a top-down view of the first exemplary semiconductor structure after formation of a gate structure and source and drain extension regions according to the first embodiment of the present disclosure.

FIG. 3B is a vertical cross-sectional view of the first exemplary semiconductor structure along the vertical plane B-B' in FIG. 3A.

FIG. 3C is a vertical cross-sectional view of the first exemplary semiconductor structure along the vertical plane C-C' in FIG. 3A.

FIG. 3D is a vertical cross-sectional view of the first exemplary semiconductor structure along the vertical plane D-D' in FIG. 3A.

FIG. 4A is a top-down view of the first exemplary semiconductor structure after removal of physically exposed portions of the dielectric material layer employing the gate structure as an etch mask according to the first embodiment of the present disclosure.

FIG. 4B is a vertical cross-sectional view of the first exemplary semiconductor structure along the vertical plane B-B' in FIG. 4A.

FIG. 4C is a vertical cross-sectional view of the first exemplary semiconductor structure along the vertical plane C-C' in FIG. 4A.

FIG. 4D is a vertical cross-sectional view of the first exemplary semiconductor structure along the vertical plane D-D' in FIG. 4A.

FIG. 6A is a top-down view of the first exemplary semiconductor structure after removal of physically exposed portions of the semiconductor fins employing the gate structure and the gate spacer as an etch mask according to the first embodiment of the present disclosure.

FIG. 6B is a vertical cross-sectional view of the first exemplary semiconductor structure along the vertical plane B-B' in FIG. 6A.

FIG. 6C is a vertical cross-sectional view of the first exemplary semiconductor structure along the vertical plane C-C' in FIG. 6A.

FIG. 6D is a vertical cross-sectional view of the first exemplary semiconductor structure along the vertical plane D-D' in FIG. 6A.

FIG. 8A is a top-down view of a variation of the first exemplary semiconductor structure after patterning of the stress-generating active semiconductor material layer into a source region and a drain region according to the first embodiment of the present disclosure.

FIG. 8B is a vertical cross-sectional view of the first exemplary semiconductor structure along the vertical plane B-B' in FIG. 8A.

FIG. 8C is a vertical cross-sectional view of the first exemplary semiconductor structure along the vertical plane C-C' in FIG. 8A.

FIG. 8D is a vertical cross-sectional view of the first exemplary semiconductor structure along the vertical plane D-D' in FIG. 8A.

FIG. 10A is a top-down view of the first exemplary semiconductor structure after formation of a contact level dielectric layer and contact via structures according to the first embodiment of the present disclosure.

FIG. 10B is a vertical cross-sectional view of the first exemplary semiconductor structure along the vertical plane B-B' in FIG. 10A.

FIG. 10C is a vertical cross-sectional view of the first exemplary semiconductor structure along the vertical plane C-C' in FIG. 10A.

FIG. 10D is a vertical cross-sectional view of the first exemplary semiconductor structure along the vertical plane D-D' in FIG. 10A.

FIG. 11A is a top-down view of a variation of the first exemplary semiconductor structure after formation of a contact level dielectric layer and contact via structures according to the first embodiment of the present disclosure.

FIG. 11B is a vertical cross-sectional view of the first exemplary semiconductor structure along the vertical plane B-B' in FIG. 11A.

FIG. 11C is a vertical cross-sectional view of the first exemplary semiconductor structure along the vertical plane C-C' in FIG. 11A.

FIG. 11D is a vertical cross-sectional view of the first exemplary semiconductor structure along the vertical plane D-D' in FIG. 11A.

FIG. 12A is a top-down view of a second exemplary semiconductor structure after formation of a disposable gate structure, a gate spacer, and stress-generating active semiconductor regions according to a second embodiment of the present disclosure.

FIG. 12B is a vertical cross-sectional view of the second exemplary semiconductor structure along the vertical plane B-B' in FIG. 12A.

FIG. 12C is a vertical cross-sectional view of the second exemplary semiconductor structure along the vertical plane C-C' in FIG. 12A.

FIG. 12D is a vertical cross-sectional view of the second exemplary semiconductor structure along the vertical plane D-D' in FIG. 12A.

FIG. 13A is a top-down view of a second exemplary semiconductor structure after formation of a planarization dielectric layer according to the second embodiment of the present disclosure.

FIG. 13B is a vertical cross-sectional view of the second exemplary semiconductor structure along the vertical plane B-B' in FIG. 13A.

FIG. 13C is a vertical cross-sectional view of the second exemplary semiconductor structure along the vertical plane C-C' in FIG. 13A.

FIG. 13D is a vertical cross-sectional view of the second exemplary semiconductor structure along the vertical plane D-D' in FIG. 13A.

FIG. 14A is a top-down view of a second exemplary semiconductor structure after formation of a replacement gate structure according to the second embodiment of the present disclosure.

FIG. 14B is a vertical cross-sectional view of the second exemplary semiconductor structure along the vertical plane B-B' in FIG. 14A.

FIG. 14C is a vertical cross-sectional view of the second exemplary semiconductor structure along the vertical plane C-C' in FIG. 14A.

FIG. 14D is a vertical cross-sectional view of the second exemplary semiconductor structure along the vertical plane D-D' in FIG. 14A.

FIG. 15A is a top-down view of the second exemplary semiconductor structure after formation of a contact level dielectric layer and contact via structures according to the second embodiment of the present disclosure.

FIG. 15B is a vertical cross-sectional view of the second exemplary semiconductor structure along the vertical plane B-B' in FIG. 15A.

FIG. 15C is a vertical cross-sectional view of the second exemplary semiconductor structure along the vertical plane C-C' in FIG. 15A.

FIG. 15D is a vertical cross-sectional view of the second exemplary semiconductor structure along the vertical plane D-D' in FIG. 15A.

FIG. 16A is a top-down view of a variation of the second exemplary semiconductor structure after formation of a contact level dielectric layer and contact via structures according to the second embodiment of the present disclosure.

FIG. 16B is a vertical cross-sectional view of the second exemplary semiconductor structure along the vertical plane B-B' in FIG. 16A.

FIG. 16C is a vertical cross-sectional view of the second exemplary semiconductor structure along the vertical plane C-C' in FIG. 16A.

FIG. 16D is a vertical cross-sectional view of the second exemplary semiconductor structure along the vertical plane D-D' in FIG. 16A.

DETAILED DESCRIPTION

Figure 1C:
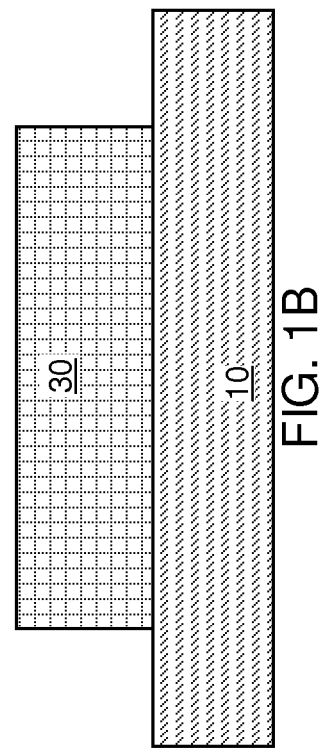
FIG. 1C is a vertical cross-sectional view of the first exemplary semiconductor structure along the vertical plane C-C' in FIG. 1A.

As stated above, the present disclosure relates to a fin field effect transistor on a bulk substrate that includes stress-generating active semiconductor regions anchored to an underlying semiconductor layer, and a method of manufacturing the same. Aspects of the present disclosure are now described in detail with accompanying figures. It is noted that like reference numerals refer to like elements across different embodiments. The drawings are not necessarily drawn to scale.

Figure 1A:
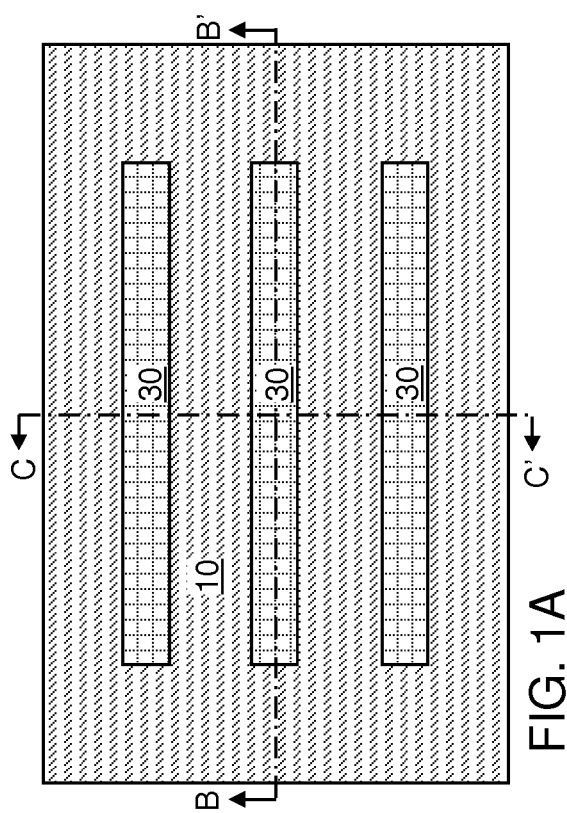
FIG. 1A is a top-down view of a first exemplary semiconductor structure after formation of a plurality of semiconductor fins according to a first embodiment of the present disclosure.
Figure 1B:
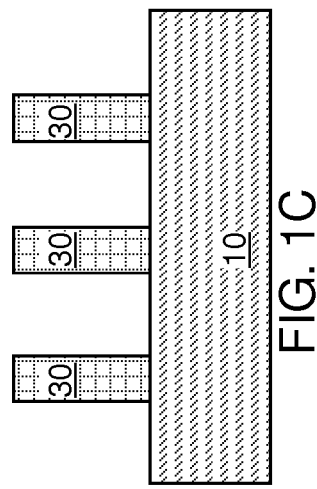
FIG. 1B is a vertical cross-sectional view of the first exemplary semiconductor structure along the vertical plane B-B' in FIG. 1A.
Figure 5A:
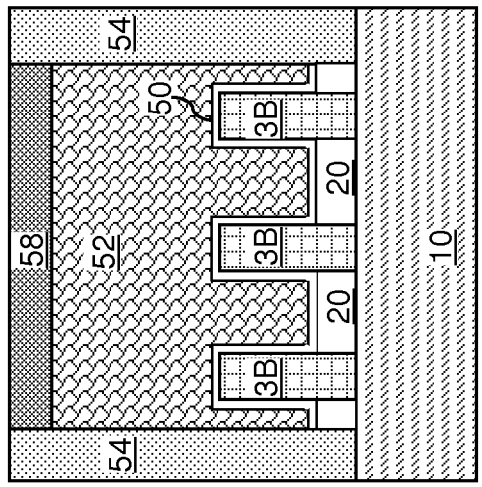
FIG. 5A is a top-down view of the first exemplary semiconductor structure after formation of a gate spacer according to the first embodiment of the present disclosure.
Figure 5C:
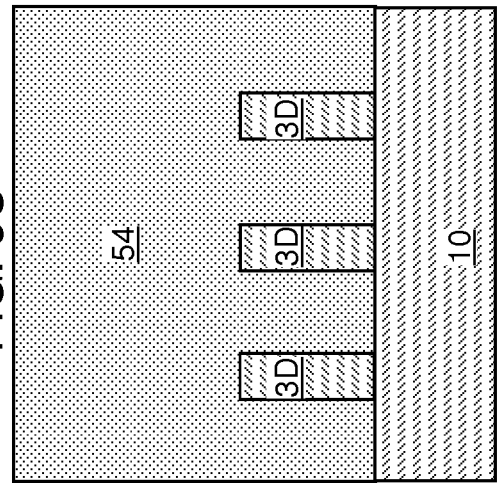
FIG. 5C is a vertical cross-sectional view of the first exemplary semiconductor structure along the vertical plane C-C' in FIG. 5A.
Figure 5B:
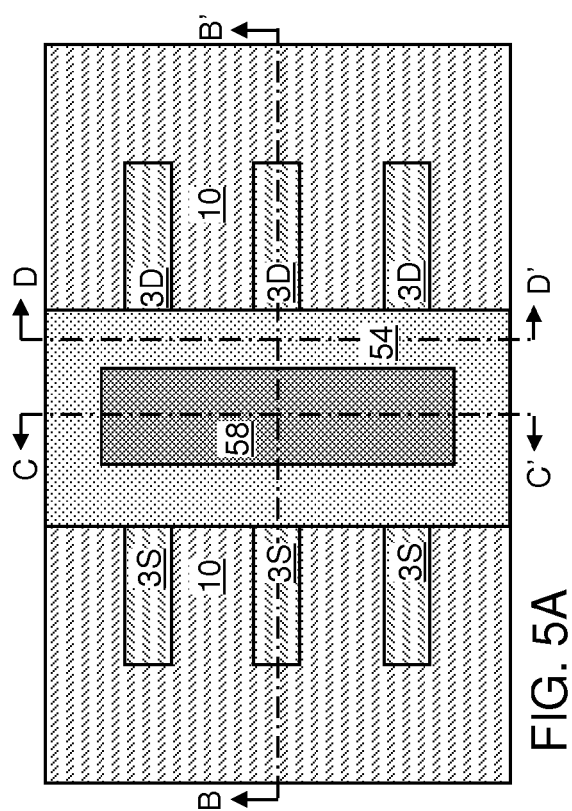
FIG. 5B is a vertical cross-sectional view of the first exemplary semiconductor structure along the vertical plane B-B' in FIG. 5A.
Figure 5D:
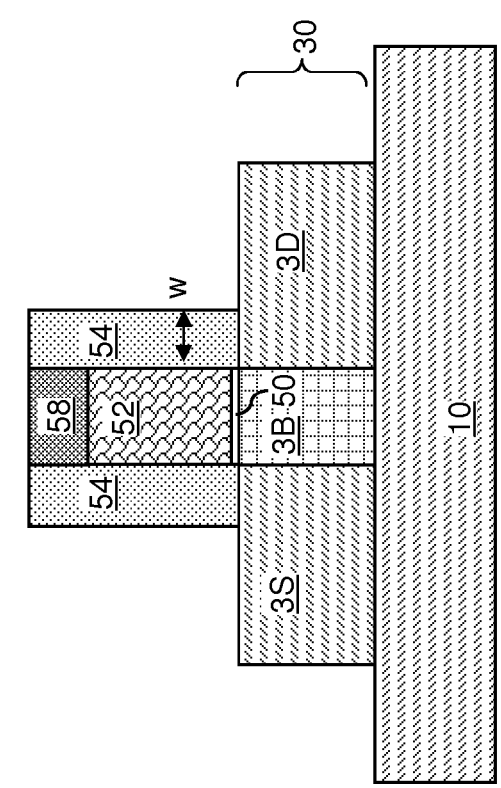
FIG. 5D is a vertical cross-sectional view of the first exemplary semiconductor structure along the vertical plane D-D' in FIG. 5A.
Figure 7C:
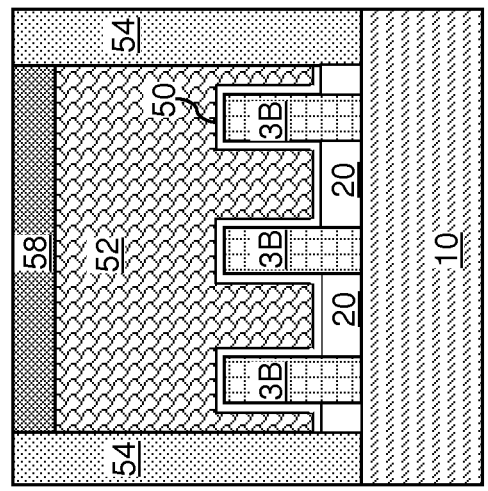
FIG. 7C is a vertical cross-sectional view of the first exemplary semiconductor structure along the vertical plane C-C' in FIG. 7A.
Figure 7D:
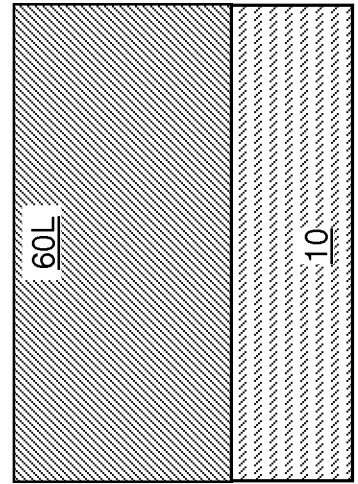
FIG. 7D is a vertical cross-sectional view of the first exemplary semiconductor structure along the vertical plane D-D' in FIG. 7A.
Figure 7A:
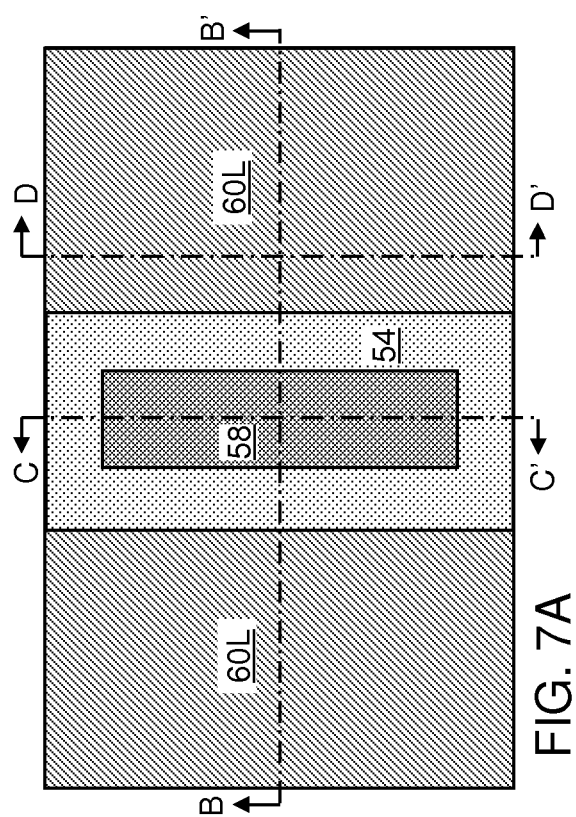
FIG. 7A is a top-down view of the first exemplary semiconductor structure after formation of a stress-generating active semiconductor material layer by selective epitaxy according to the first embodiment of the present disclosure.
Figure 7B:
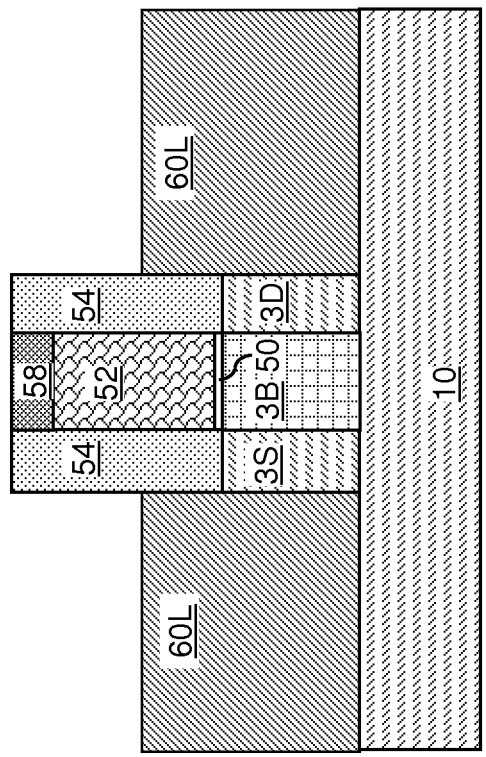
FIG. 7B is a vertical cross-sectional view of the first exemplary semiconductor structure along the vertical plane B-B' in FIG. 7A.
Figure 9C:
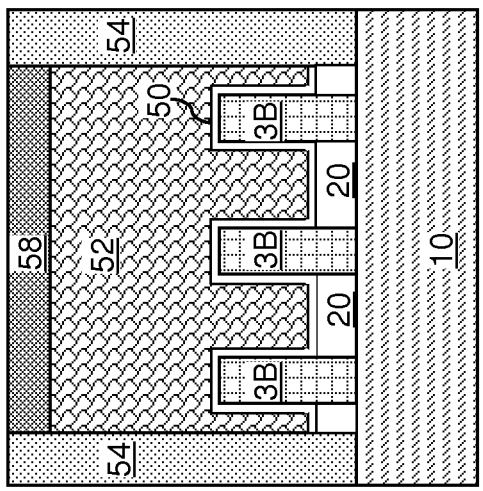
FIG. 9C is a vertical cross-sectional view of the first exemplary semiconductor structure along the vertical plane C-C' in FIG. 9A.
Figure 9D:
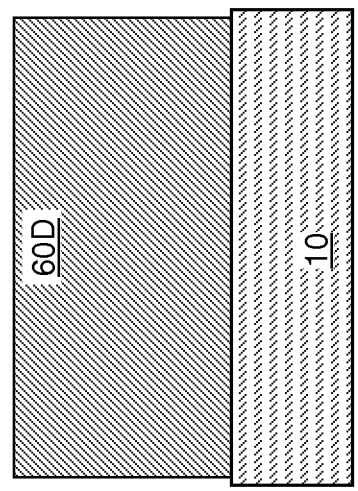
FIG. 9D is a vertical cross-sectional view of the first exemplary semiconductor structure along the vertical plane D-D' in FIG. 9A.
Figure 9A:
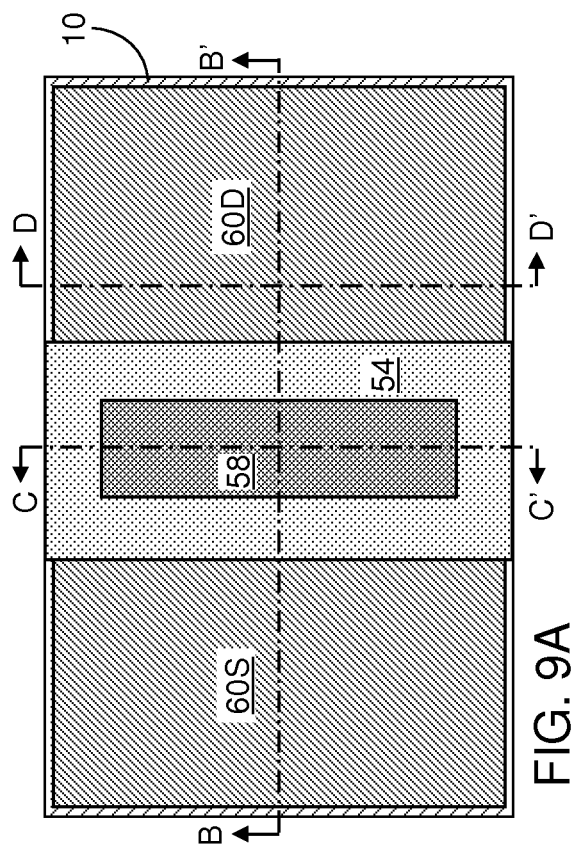
FIG. 9A is a top-down view of the first exemplary semiconductor structure after removal of a photoresist layer according to the first embodiment of the present disclosure.
Figure 9B:
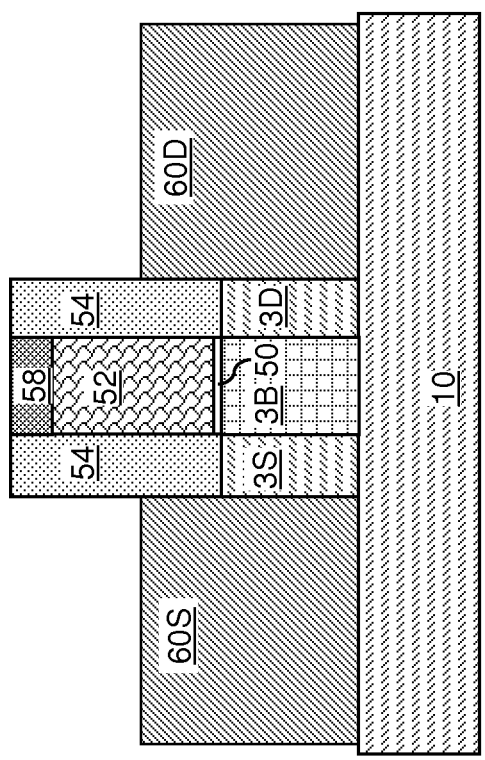
FIG. 9B is a vertical cross-sectional view of the first exemplary semiconductor structure along the vertical plane B-B' in FIG. 9A.

Referring to FIGS. 1A-1C, a first exemplary semiconductor structure according to a first embodiment of the present disclosure includes a single crystalline material layer 10 and a plurality of semiconductor fins 30 formed on a top surface thereof. As used herein, a "semiconductor fin" refers to a semiconductor material portion having a pair of parallel sidewalls. The direction about which the moment of inertia of a semiconductor fin is at a minimum is herein referred to as a "lengthwise direction" of the semiconductor fin. The lengthwise direction of the semiconductor fin can be a horizontal direction such as the horizontal direction contained in the plane B-B'.

In one embodiment, the single crystalline material layer 10 can be a single crystalline semiconductor material layer including a first single crystalline semiconductor material. The substrate semiconductor material can be, for example, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the substrate semiconductor material comprises single crystalline silicon.

In another embodiment, the single crystalline material layer 10 can be a single crystalline rare-earth oxide material, which is an oxide material of a rare-earth element. Rare earth elements are also referred to as Lanthanides, and include La, Ce, Pr, Nd, Pm, Sm, Eu, Gd, Tb, Dy, Ho, Er, Tm, Yb, and Lu. The ionic radii of rare earth elements decrease gradually with the atomic number, and the total variation of the ionic radii of rare earth elements is less than 15% among one another. The rare earth elements form various single crystalline dielectric oxides with a valance of +3, i.e., a dielectric oxide having a chemical formula of $M_2O_3$, in which M can be any of the rare earth elements. Crystalline rare earth oxides are lattice coincident on a class of elemental or alloyed single crystalline semiconductor materials including single crystalline silicon, a single crystalline silicon-germanium alloy, a single crystalline silicon-carbon alloy, and a single crystalline silicon-germanium-carbon alloy. For each single crystalline $M_2O_3$ in which M is a rare earth element, at least one single crystalline semiconductor material having a lattice constant that is one half the lattice constant of the single crystalline $M_2O_3$ exists among single crystalline silicon, a single crystalline silicon-germanium alloy, a single crystalline silicon-carbon alloy, and a single crystalline silicon-germanium-carbon alloy.

The plurality of semiconductor fins 30 includes a fin semiconductor material. The fin semiconductor material may be selected from, but is not limited to, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the semiconductor material can include single crystalline silicon or a single crystalline alloy of silicon. In one embodiment, the semiconductor material in each of the plurality of semiconductor fins 30 can be single crystalline. The semiconductor material of the plurality of semiconductor fins 30 can be the same as, or different from, the semiconductor material of the single crystalline semiconductor material layer 10.

The plurality of semiconductor fins 30 can be formed, for example, by forming, and subsequently patterning, a single crystalline semiconductor layer on the top surface of the single crystalline material layer 10. In one embodiment, the single crystalline semiconductor layer can be formed, for example, by epitaxial deposition of the fin semiconductor material directly on the top surface of the single crystalline material layer 10. Subsequently, a photoresist layer can be applied over the single crystalline semiconductor layer, and lithographically patterned employing methods known in the art. The plurality of semiconductor fins 30 can be formed by transferring the pattern in the patterned photoresist layer into the single crystalline material layer employing an anisotropic etch. Optionally, dielectric fin caps (not shown) having the same horizontal cross-sectional area as an underlying semiconductor fin 30 may be formed on the top surface of each semiconductor fin 30, for example, by forming a dielectric material layer (not shown) above the single crystalline semiconductor layer prior to application of the photoresist layer, and by patterning the dielectric material layer through transfer of the pattern in the patterned photoresist layer into the dielectric material layer employing an anisotropic etch.

In one embodiment, the plurality of semiconductor fins 30 may, or may not, be doped with p-type dopants or n-type dopants. If the plurality of semiconductor fins 30 is doped, the type of doping of the plurality of semiconductor fins 30 is herein referred to as a first conductivity type. The electrical dopants may be at least one of p-type dopants such as B, Ga, and In. Alternately, the electrical dopants may be at least one of n-type dopants such as P, As, and Sb. The concentration of the electrical dopants (p-type dopants or n-type dopants) in the plurality of semiconductor fins 30 may be from $1.0 \times 10^{15}$ atoms/cm$^3$ to $1.0 \times 10^{19}$ atoms/cm$^3$, although lesser and greater concentrations can also be employed. Non-electrical stress-generating dopants such as Ge and/or C may also be present in the plurality of semiconductor fins 30 in some embodiments.

The height of the plurality of semiconductor fins can be from 20 nm to 300 nm, although greater and lesser thicknesses can also be employed. The width of each semiconductor fin 30 along the horizontal direction included in the vertical plane C-C' can be from 3 nm to 100 nm, although lesser and greater widths can also be employed. The length of each semiconductor fin 30 along the direction perpendicular to the vertical plane C-C' can be from 60 nm to 1,000 nm, although lesser and greater lengths can also be employed.

Referring to FIGS. 2A-2C, a dielectric material layer 20L can be formed around bottom portions of the plurality of semiconductor fins 30. The dielectric material layer 20L can be formed, for example, by deposition of a dielectric material such as silicon oxide to fill the spaces among the plurality of semiconductor fins 30. The dielectric material layer 20L can be deposited, for example, by chemical vapor deposition (CVD). The dielectric material can be deposited to a height above the topmost surfaces of the plurality of semiconductor fins, and can be planarized employing the top surfaces of the plurality of semiconductor fins as a stopping plane. The planarization of the deposited dielectric material can be performed, for example, by chemical mechanical planarization (CMP). Subsequently, the dielectric material is recessed to a height between the top surfaces of the plurality of semiconductor fins 30 and the bottom surfaces of the semiconductor fins 30. The remaining portion of the dielectric material constitutes the dielectric material layer 20L. The dielectric material layer 20L has a top surface below the horizontal plane including top surfaces of the plurality of semiconductor fins 30. The thickness of the dielectric material layer 20L can be, for example, in a range from 5 nm to 100 nm, although lesser and greater thicknesses can also be employed. The bottom surface of the dielectric material layer 20L can be coplanar with the bottom surfaces of the plurality of semiconductor fins 30.

Referring to FIGS. 3A-3D, a gate structure (50, 52, 58) and source and drain extension regions (3S, 3D) are formed. The gate structure (50, 52, 58) straddles the plurality of semiconductor fins 30, and is formed directly on the dielectric material layer 20L. The gate structure (50, 52, 58) includes a vertical stack of at least a gate dielectric 50 and a gate electrode 52.

For example, a gate dielectric 50, a gate electrode 52, and a gate cap dielectric 58 can be formed over a middle portion of each semiconductor fin 30 by deposition and patterning of a gate dielectric layer, a gate conductor layer, and a gate cap dielectric layer. The gate dielectric layer can be formed conformally on the surfaces of the plurality of semiconductor fins 30.

In one embodiment, the gate dielectric layer can include a dielectric material formed by thermal conversion of a portion of the semiconductor fin, such as silicon oxide or silicon nitride. Thermal oxidation, thermal nitridation, plasma oxidation, plasma nitridation, or a combination thereof may be employed to form the gate dielectric layer. In this case, the gate dielectric layer can be formed only on physically exposed surfaces of the plurality of semiconductor fin 30.

Alternately or additionally, the gate dielectric layer may include a high-k dielectric material having a dielectric constant greater than 3.9, i.e., the dielectric constant of silicon oxide. The high-k dielectric material may comprise a dielectric metal oxide containing a metal and oxygen. In one embodiment, the dielectric constant of the high-k material is greater than or about 4.0. In one embodiment, the dielectric constant of the high-k dielectric material is greater than the dielectric constant of silicon nitride, which is about 7.5. In one embodiment, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x can be independently from about 0.5 to about 3 and each value of y can be independently from 0 to about 2. Optionally, an interfacial layer (not shown), for example, silicon oxide, can be formed by chemical oxidation or thermal oxidation before the high-k dielectric material is deposited.

The gate conductor layer can be deposited on the gate dielectric layer, for example, by chemical vapor deposition (CVD). The gate conductor layer may comprise a doped semiconductor material or a metallic material. Non-limiting examples of the semiconductor materials include amorphous silicon, polysilicon, an amorphous silicon germanium alloy, or a polycrystalline silicon germanium alloy. Non-limiting examples of metallic materials include W, Ta, TiN, ZrN, HfN, VN, NbN, TaN, WN, TiAlN, TaC, TaMgC, TaCN, other conductive refractory metal nitrides, and an alloy thereof. The gate conductor layer may be formed by chemical vapor deposition (CVD), physical vapor deposition (PVD), atomic layer deposition (ALD), vacuum evaporation, etc. In one embodiment, the thickness of the gate conductor layer may be from 20 nm to 300 nm.

The gate cap dielectric layer can be formed by deposition of a dielectric material. In one embodiment, the dielectric material of the gate cap dielectric layer can be silicon nitride. The thickness of the gate cap dielectric layer can be in a range from 20 nm to 300 nm, although lesser and greater thicknesses can also be employed.

The stack of the gate dielectric layer, the gate conductor layer, and the gate cap dielectric layer can be lithographically patterned by application and patterning of a photoresist material, and by transfer of the pattern in the photoresist material into the stack. Employing the patterned photoresist as an etch mask, the anisotropic etch can remove the physically exposed portions of the gate cap dielectric layer and the gate conductor layer selective to the gate dielectric layer. The physically exposed portions of the gate dielectric layer can subsequently be removed selective to the semiconductor material of the plurality of semiconductor fins 30, for example, by an isotropic etch such as a wet etch. A remaining portion of the gate cap dielectric layer constitutes a gate cap dielectric 58, a remaining portion of the gate conductor layer constitutes a gate electrode 52, and a remaining portion of the gate dielectric layer constitutes a gate dielectric 50. The gate dielectric 50, the gate electrode 52, and the gate cap dielectric 58 constitute the gate stack (50, 52, 58).

Referring to FIGS. 4A-4D, physically exposed portions of the dielectric material layer 20L can be removed in an anisotropic etch process employing the gate structure (50, 52, 58) as an etch mask. For example, the gate cap dielectric 58 can include silicon oxide and the dielectric material layer 20L can include a doped or undoped silicon oxide material. In this case, an anisotropic etch chemistry for etching a silicon oxide material selective to silicon nitride can be employed. The anisotropic etch that removes the physically exposed portions of the dielectric material layer 20L may, or may not, be selective to the material of the single crystalline material layer 10. Further, the anisotropic etch that removes the physically exposed portions of the dielectric material layer 20L may, or may not, be selective to the material of the plurality of semiconductor fins 30.

An extension ion implantation can be performed to form a source extension region 3S and a drain extension region 3D in portions of each semiconductor fin 30 that do not underlie the gate structure (50, 52, 58). An implanted portion of each semiconductor fin 30 constitutes a channel region 3B, which underlies the gate structure (50, 52, 58) and laterally contacts a source extension region 3S and a drain extension region 3D.

If the plurality of semiconductor fins 30 as provided at the processing steps of FIGS. 2A-2C includes an intrinsic semiconductor material, the channel regions 3B includes an intrinsic semiconductor material, and the source extension regions 3S and the drain extension regions 3D can include a p-doped semiconductor material or an n-doped semiconductor material. If the plurality of semiconductor fins 30 as provided at the processing steps of FIGS. 2A-2C includes a doped semiconductor material having a doping of the first conductivity type, the channel regions 3B includes a doped semiconductor material having a doping of the first conductivity type, and the source extension regions 3S and the drain extension regions 3D include a doped semiconductor material having a doping of a second conductivity type that is the opposite of the first conductivity type. For example, if the first conductivity type is p-type, the second conductivity type is n-type, and vice versa.

Patterning the dielectric material layer 20L employing the gate structure (50, 52, 58) as an etch mask for the anisotropic etch process forms at least one dielectric material portion 20, each of which is a remaining portion of the dielectric material layer 20L. The at least one dielectric material portion 20 can be a plurality of dielectric material portions 20.

In one embodiment, each sidewall of the at least one dielectric material portion 20 is in physical contact with a sidewall of the plurality of semiconductor fins 20, or is vertically coincident with a sidewall of the gate structure (50, 52, 58) upon patterning of the dielectric material layer 20L.

Referring to FIGS. 5A-5D, a gate spacer 54 can be formed around each gate stack (50, 52, 58). The gate spacers 54 can be formed, for example, by depositing a conformal dielectric material layer and by anisotropically etching the conformal dielectric material layer by an anisotropic etch. The anisotropic etch recesses the portions of the conformal dielectric material layer located on sidewalls of the semiconductor fins 30. Further, the anisotropic etch removes portions of the conformal dielectric material layer that are laterally spaced from the gate electrodes (50, 52, 58) by a distance greater than the thickness of the conformal dielectric layer. The remaining vertical portions of the conformal dielectric material layer constitute the gate spacers 54. End portions of the semiconductor fins 30 including distal portions of the source extension regions 3S and the drain extension regions 3D are physically exposed after formation of the gate spacer 54.

The gate spacer 54 is formed directly on sidewalls of the gate structure (50, 52, 58) and sidewalls of the at least one dielectric material portion 20 and the top surface of the semiconductor material layer 10. Thus, all sidewalls of the at least one dielectric material portion 20 are in physical contact with the gate spacer 54 or sidewalls of the plurality of semiconductor fins 30. The width w of the gate spacer 54 can be in a range from 3 nm to 100 nm, although lesser and greater widths can also be employed.

Referring to FIGS. 6A-6D, physically exposed portions of the plurality of semiconductor fins 30 are removed by an etch process that employs a combination of the gate structure (50, 52, 58) and the gate spacer 54 as an etch mask. Distal portions of the source extension regions 3S and the drain extension regions 3D are removed by the anisotropic etch. Physically exposed sidewalls of the plurality of semiconductor fins 30 after the etch process are vertically coincident with outer sidewalls of the gate spacer 54. The physically exposed sidewalls of the plurality of semiconductor fins 30 are sidewall surfaces of the source extension regions 3S and the drain extension regions 3D.

After the anisotropic etch, each of the plurality of semiconductor fins 30 includes a source-side extension region 3S in contact with the gate spacer 54, a drain-side extension region 3D in contact with the gate spacer 54, and a channel region 3B. Each channel region 3B is in contact with the gate dielectric 50, the semiconductor material layer 10, the source-side extension region 3S, and the drain-side extension region 3D.

Referring to FIGS. 7A-7D, a stress-generating active semiconductor material layer 60L is formed by selective epitaxy of a stress-generating semiconductor material, which has a different lattice constant from the single crystalline material of the single crystalline material layer 10. The stress-generating semiconductor material is deposited directly on the top surface of the semiconductor material layer with epitaxial alignment with the substrate semiconductor material in the semiconductor material layer 10.

The stress-generating active semiconductor material layer 60L can be formed on each physically exposed portion of the top surface of the single crystalline semiconductor material layer 10 and each physically exposed surface of the semiconductor fins (3S, 2D, 3B) by selective epitaxial deposition of the stress-generating semiconductor material. In one embodiment, the stress-generating active semiconductor material layer 60L can be formed as a single contiguous material layer. In one embodiment, the stress-generating active semiconductor material layer 60L can include a single crystalline semiconductor material portions that are epitaxially aligned to the fin semiconductor material of the semiconductor fins (3B, 3S, 3D) and/or the substrate semiconductor material of the single crystalline semiconductor material layer 10. As used herein, "epitaxial" alignment refers to alignment of atoms in a same singe crystalline structure. Each of the semiconductor fins (3B, 3S, 3D) and the single crystalline semiconductor material layer 10 can be single crystalline, and the stress-generating active semiconductor material layer 60L can be epitaxially aligned to the single crystalline semiconductor material layer 10 and to the plurality of semiconductor fin (3B, 3S, 3D).

In selective epitaxy, the exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate of the deposited semiconductor material is the difference between the deposition rate of a semiconductor material due to the reactant gas less the etch rate of the semiconductor material due to the etchant gas. The selective epitaxy process does not deposit any semiconductor material on amorphous surfaces such as the surfaces of the inner gate spacer 54 or the gate cap dielectric 58 because any semiconductor material that nucleates on the amorphous surfaces is etched by the etchant gas before a contiguous layer of a deposited semiconductor material can be formed on the dielectric surfaces. However, deposition of the stress-generating semiconductor material of the stress-generating active semiconductor material layer 60L proceeds on the single crystalline surfaces of the single crystalline material layer 10 and the sidewall surfaces of the source extension regions 3S and the drain extension regions 3D because the deposition rate is greater than the etch rate on the single crystalline surfaces.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H_2$, $N_2$, or Ar can be employed in conjunction with the reactant gas and/or the etchant gas.

In one embodiment, the stress-generating active semiconductor material layer 60L can be formed with in-situ doping so that the stress-generating active semiconductor material layer 60L is doped with electrical dopants during the selective epitaxy. The stress-generating active semiconductor material layer 60L can be doped with electrical dopants having the same conductivity type as the doping of the source extension regions 3S and the drain extension regions 3D, which can be, for example, dopants of the second conductivity type.

Alternately, the stress-generating active semiconductor material layer 60L can be formed without doping, i.e., as an intrinsic semiconductor material layer. In this case, electrical dopants can be introduced into the stress-generating active semiconductor material layer 60L in a subsequent processing step, for example, by ion implantation or plasma doping.

The stress-generating semiconductor material can be different from the fin semiconductor material, i.e., the semiconductor material of the plurality of semiconductor fins (3B, 3S, 3D). In one embodiment, the stress-generating semiconductor material within the stress-generating active semiconductor material layer 60L can have a smaller lattice constant than the substrate semiconductor material within the single crystalline material layer 10. In this case, the stress-generating active semiconductor material layer 60L applies a tensile stress along the longitudinal direction of the plurality of semiconductor fins 30, i.e., along the direction that connects each pair of a source extension region 3S and a drain extension region 3D within a semiconductor fin (3S, 3D, 3B).

In another embodiment, the stress-generating semiconductor material within the stress-generating active semiconductor material layer 60L can have a greater lattice constant than the substrate semiconductor material within the single crystalline material layer 10. In this case, the stress-generating active semiconductor material layer 60L applies a compressive stress along the longitudinal direction of the plurality of semiconductor fins 30, i.e., along the direction that connects each pair of a source extension region 3S and a drain extension region 3D within a semiconductor fin (3S, 3D, 3B).

Further, the stress-generating active semiconductor material layer 60L is not free to change volumes because the stress-generating active semiconductor material layer 60L is epitaxially aligned to the substrate semiconductor material of the single crystalline semiconductor material layer 10 and the fin semiconductor material of the plurality of semiconductor fins 30. The epitaxial alignment of the stress-generating active semiconductor material layer 60L to the substrate semiconductor material and the fin semiconductor material prevents relaxation of the lattice constant in the stress-generating active semiconductor material layer 60L. Transmission of stress from the stress-generating active semiconductor material layer 60L to the channel regions 3B is more effective due to the inability of the stress-generating active semiconductor material layer 60L to relax.

Referring to FIGS. 8A-8D, the stress-generating active semiconductor material layer 50L can be patterned into stress-generating active semiconductor regions (60S, 60D).

As used herein, "active semiconductor regions" collectively refer to source regions and drain regions of field effect transistors. The stress-generating active semiconductor regions (60S, 60D) include a source region 60S and a drain region 60D. For example, a photoresist layer 77 can be applied and patterned over the stress-generating active semiconductor material layer 50L. The stress-generating active semiconductor material layer 50L can be patterned into the source region 60S and the drain region 60D by an anisotropic etch that employs the patterned photoresist layer as an etch mask.

The source region 60S is formed directly on first sidewalls of the plurality of semiconductor fins 30 that are located on one side of the gate stack (50, 52, 58), and the drain region 60D is formed directly on second sidewalls of the plurality of semiconductor fins 30 that are located on the opposite side of the gate stack (50, 52, 48). Each of the source region 60S and the drain region 60D is single crystalline, and is epitaxially aligned to the single crystalline semiconductor material, i.e., the substrate semiconductor material, within the semiconductor material layer 10. The source region 60S and the drain region 60D include a doped semiconductor material having a lattice constant that is different from the lattice constant of the single crystalline material of the single crystalline material layer 10. The source region 60S and the drain region 60D apply a stress to portions of the plurality of semiconductor fins (3S, 3D, 3B) that are present after formation of the source region 60S and the drain region 60D. Each of the source region 60S and the drain region 60D is formed directly on the top surface of the single crystalline material layer 10.

Referring to FIGS. 9A-9D, the photoresist layer can be removed, for example, by ashing. The first exemplary semiconductor structure includes a single crystalline material layer 10 located in a substrate, a plurality of semiconductor fins (3S, 3D, 3B) located on a top surface of the semiconductor material layer 10, at least one dielectric material portion 20 located on the top surface of the single crystalline material layer 10 and laterally contacting bottom portions of the plurality of semiconductor fins (3S, 3D, 3B), a gate structure (50, 52, 58) including a vertical stack of a gate dielectric 50 and a gate electrode 52 and contacting a top surface of each of the at least one dielectric material portion 20 and sidewalls of the plurality of semiconductor fins 30, and a gate spacer 54 laterally contacting sidewalls of the gate structure (50, 52, 58) and sidewalls of the at least one dielectric material portion 20 and a top surface of the single crystalline material layer 10.

All sidewall surfaces of the at least one dielectric material portion 20 are vertically coincident with sidewalls of the gate structure (50, 52, 58) or sidewalls of the plurality of semiconductor fins 30. The source region 60S overlies a first portion of the single crystalline material layer 10, and is in contact with first sidewalls of the plurality of semiconductor fins 30. The drain region overlies a second portion of the single crystalline material layer 10, and is in contact with second sidewalls of the plurality of semiconductor fins 30. Bottom surfaces of the source region 60S and the drain region 60D are located below a horizontal plane including at least one top surface of the at least one dielectric material portion 20. The at least one dielectric material portion 20 is laterally spaced from the source region 60S and the drain region 60D by a width w of the gate spacer 54.

Each of the source region 60S and the drain region 60D can be single crystalline, and can be epitaxially aligned to the single crystalline material within the single crystalline material layer 10. The source region 60S and the drain region 60D can include a doped semiconductor material having a lattice constant that is different from the lattice constant of the single crystalline material, and can apply a stress to the plurality of semiconductor fins (3S, 3D, 3B). Each of the source region 60S and the drain region 60D can be in physical contact with the top surface of the single crystalline material layer 10.

In one embodiment, interfaces between the plurality of semiconductor fins (3S, 3D, 3B) and the source region 60S and interfaces between the plurality of semiconductor fins (3S, 3D, 3B) and the drain region are vertically coincident with outer sidewalls of the gate spacer 54.

Referring to FIGS. 10A-10D, a contact level dielectric layer 90 can be deposited over the gate structure (50, 52, 58), the gate spacer 54, the source region 60S, and the drain region 60D. The contact level dielectric layer 90 includes a dielectric material such as doped or undoped silicon oxide, silicon nitride, a porous or non-porous organosilicate glass (OSG), or a combination thereof. The contact level dielectric layer 90 can be formed, for example, by chemical vapor deposition (CVD) or by spin coating.

Various contact via structures (9S, 9D, 9G) can be formed through the contact level dielectric layer 90 to provide electrical contact to various components of the field effect transistor including the source region 60S, the drain region 60D, and the gate electrode 52. For example, a source-side contact via structure 9S can contact the source region 60S, a drain-side contact via structure 9D can contact the drain region 60D, and a gate-side contact via structure 9G can contact the gate electrode 52.

Referring to FIGS. 11A-11D, a variation of the first exemplary semiconductor structure can be derived from the first exemplary semiconductor structure by selectively depositing an intrinsic semiconductor material layer by another selective epitaxy process directly on the top surface of the single crystalline material layer 10 after the processing steps of FIGS. 6A-6D and prior to the processing steps of FIGS. 7A-7D. The thickness of the intrinsic semiconductor material layer can be less than the thickness of the at least one dielectric material portion 20. The intrinsic semiconductor material layer can be lattice mismatched with respect to the single crystalline material layer 10, or may be lattice matched to the single crystalline material layer 10. The thickness of the intrinsic semiconductor material layer is selected such that the stress applied to the channel regions 3B does not decrease significantly due to the intrinsic semiconductor material layer.

Subsequently, the stress-generating active semiconductor material layer 60L can be deposited directly on the top surface of the intrinsic semiconductor material layer employing the processing steps illustrated in FIGS. 7A-7D. At the processing steps of FIGS. 8A-8D, the intrinsic semiconductor material layer can be patterned with the stress-generating active semiconductor material layer 60L to form a source-side intrinsic semiconductor material portion 59S and a drain-side intrinsic semiconductor material portion 59D. The source-side intrinsic semiconductor material portion 59S is formed directly on a first portion of the top surface of the single crystalline material layer 10. The drain-side intrinsic semiconductor material portion 59D is formed directly on a second portion of the top surface of the single crystalline material layer 10. The source region 60S is formed directly on the source-side intrinsic semiconductor material portion 59S, and the drain region 60D is formed directly on the drain-side intrinsic semiconductor material portion 59D.

Referring to FIGS. 12A-12D, a second exemplary semiconductor according to a second embodiment of the present disclosure can be derived from the first exemplary semiconductor structure of FIGS. 2A-2C by forming a disposable gate structure (50', 52', 58') instead of the gate structure (50, 52, 58) of the first embodiment. The processing steps of FIGS. 4A-4D, 5A-5D, 6A-6D, 7A-7D, 8A-8D, and 9A-9D are subsequently performed to provide the second exemplary semiconductor structure illustrated in FIGS. 12A-12D.

The disposable gate structure (50', 52', 58') includes a stack of a disposable material that can be removed selective to the gate spacer 54. For example, the disposable gate structure 50' can include a disposable gate dielectric 50', a disposable gate material portion 52', and a disposable gate cap dielectric 58'. The disposable gate dielectric 50' can include a dielectric material such as silicon oxide. The disposable gate material portion 52' can include a material such as germanium or amorphous carbon. The disposable gate cap dielectric 58' is an optional component, and if present, can include a dielectric material such as borosilicate glass, organosilicate glass, silicon nitride, or combinations thereof. Other dielectric materials, semiconductor materials, conductive materials can be employed provided that such materials can be removed selective to the gate spacer 54 and, optionally, selective to the dielectric material of a planarization dielectric layer to be subsequently formed.

Referring to FIGS. 13A-13D, a planarization dielectric layer 70 can be formed over the source region 60S and the drain region 60D. The planarization dielectric layer 70 includes a dielectric material such as silicon oxide. The planarization dielectric layer 70 can be formed, for example, by chemical vapor deposition (CVD) or spin coating. Portions of the deposited dielectric material of the planarization dielectric layer 70 can be removed from above a horizontal plane including the top surface of the disposable gate structure (50', 52', 58'), for example, by chemical mechanical planarization. The top surface of the planarized planarization dielectric layer 70 can be coplanar with top surfaces of the disposable gate structure (50'. 52', 58') and the gate spacer 54.

Referring to FIGS. 14A-14D, the disposable gate structure (50', 52', 58') is removed selective to the gate spacer 54 and the planarization dielectric layer 70 by etch processes, which can include, for example, wet etch processes. A gate cavity is formed in the volume from which the disposable gate structure (50', 52', 58') is removed. A replacement gate structure (150, 152) is formed within the gate cavity by deposition of a gate dielectric layer and a conductive material layer, and removal of portions of the gate dielectric layer and the conductive material layer from above the top surface of the planarization dielectric layer 70. A remaining portion of the gate dielectric layer is a gate dielectric 150, and a remaining portion of the conductive material layer is a gate electrode 152.

Referring to FIGS. 15A-15D, the processing steps of FIGS. 10A-10D are performed to form a contact level dielectric layer 90 and various contact via structures (9S, 9D, 9G).

Referring to FIGS. 16A-16D, a variation of the second exemplary semiconductor structure can be derived from the second exemplary semiconductor structure by forming a source-side intrinsic semiconductor material portion 59S and a drain-side intrinsic semiconductor material portion 59D in the same manner as the variation of the first exemplary semiconductor structure. The source-side intrinsic semiconductor material portion 59S is formed directly on a first portion of the top surface of the single crystalline material layer 10. The drain-side intrinsic semiconductor material portion 59D is formed directly on a second portion of the top surface of the single crystalline material layer 10. The source region 60S is formed directly on the source-side intrinsic semiconductor material portion 59S, and the drain region 60D is formed directly on the drain-side intrinsic semiconductor material portion 59D.

The various structures of the present disclosure provide a greater stress to the channel regions 3B than conventional structures employing stressor elements that are grown from semiconductor fins because the stress-generating active semiconductor layer can be formed on all physically exposed surfaces of the single crystalline material layer, and therefore, cannot laterally move to relieve stress. Thus, the source region and the drain region of the present disclosure are more effective in straining the channels within the semiconductor fins, and can provide a greater increase in the conductivity of minority carriers in the fin field effect transistor.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    a single crystalline material layer located in a substrate;
    a plurality of semiconductor fins located directly on a first portion of a top surface of said single crystalline material layer;
    at least one dielectric material portion located directly on a second portion of said top surface of said single crystalline material layer and laterally between each semiconductor fin of said plurality of semiconductor fins;
    a gate structure including a vertical stack of a gate dielectric and a gate electrode and contacting a top surface of each of said at least one dielectric material portion and sidewalls of said plurality of semiconductor fins; and
    a gate spacer laterally contacting sidewalls of said gate structure and sidewalls of said at least one dielectric material portion and a third portion of said top surface of said single crystalline material layer.

2. The semiconductor structure of claim 1, wherein all sidewall surfaces of said at least one dielectric material portion are vertically coincident with sidewalls of said gate structure or sidewalls of said plurality of semiconductor fins.

3. The semiconductor structure of claim 1, further comprising:
    a source region overlying a fourth portion of said top surface of single crystalline material layer and in contact with first sidewalls of said plurality of semiconductor fins; and
    a drain region overlying a fifth portion of said topmost surface of said single crystalline material layer and in contact with second sidewalls of said plurality of semiconductor fins.

4. The semiconductor structure of claim 3, wherein bottom surfaces of said source region and said drain region are located below a horizontal plane including at least one top surface of said at least one dielectric material portion.

5. The semiconductor structure of claim 3, wherein said at least one dielectric material portion is laterally spaced from said source region and said drain region by a width of said gate spacer.

6. The semiconductor structure of claim 3, wherein each of said source region and said drain region is single crystalline and is epitaxially aligned to a single crystalline material within said single crystalline material layer.

7. The semiconductor structure of claim 6, wherein said source region and said drain region comprise a doped semiconductor material having a lattice constant that is different from a lattice constant of said single crystalline material, and apply a stress to said plurality of semiconductor fins.

8. The semiconductor structure of claim 3, wherein each of said source region and said drain region is in physical contact with said top surface of said single crystalline material layer.

9. The semiconductor structure of claim 3, further comprising:
    a source-side intrinsic semiconductor material portion in contact with said fourth portion of said top surface of said single crystalline material layer and a bottom surface of said source region; and
    a drain-side intrinsic semiconductor material portion in contact with said fifth portion of said top surface of said single crystalline material layer and a bottom surface of said drain region.

10. The semiconductor structure of claim 1, wherein interfaces between said plurality of semiconductor fins and said source region and interfaces between said plurality of semiconductor fins and said drain region are vertically coincident with outer sidewalls of said gate spacer.

11. The semiconductor structure of claim 1, wherein said at least one dielectric material portion has a bottommost surface that is coplanar with a bottommost surface of each semiconductor fin of said plurality of semiconductor fins.

12. The semiconductor structure of claim 1, wherein said single crystalline material layer is a rare-earth oxide material.

13. The semiconductor structure of claim 12, wherein said rare-earth oxide comprises a rare earth element selected from La, Ce, Pr, Nd, Pm, Sm, Eu, Gd, Tb, Dy, Ho, Er, Tm, Yb and Lu.

* * * * *